US011635290B2

(12) United States Patent
Suzuki et al.

(10) Patent No.: US 11,635,290 B2
(45) Date of Patent: Apr. 25, 2023

(54) OPTICAL MODULE

(71) Applicant: HAMAMATSU PHOTONICS K.K., Hamamatsu (JP)

(72) Inventors: Tomofumi Suzuki, Hamamatsu (JP); Kyosuke Kotani, Hamamatsu (JP); Tatsuya Sugimoto, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 0 days.

(21) Appl. No.: 17/321,716

(22) Filed: May 17, 2021

(65) Prior Publication Data

US 2021/0278274 A1 Sep. 9, 2021

Related U.S. Application Data

(63) Continuation of application No. 16/625,681, filed as application No. PCT/JP2018/025633 on Jul. 6, 2018, now Pat. No. 11,067,380.

(30) Foreign Application Priority Data

Jul. 6, 2017 (JP) .................................. 2017-133089

(51) Int. Cl.
*G02B 26/08* (2006.01)
*G01B 9/02* (2022.01)
(Continued)

(52) U.S. Cl.
CPC ............ *G01B 9/02051* (2013.01); *B81B 3/00* (2013.01); *B81B 3/007* (2013.01); *B81B 3/0021* (2013.01);
(Continued)

(58) Field of Classification Search
CPC ............ G01B 9/02051; G01B 9/02049; G01B 2290/25; G01B 2290/35; B81B 3/00;
(Continued)

(56) References Cited

U.S. PATENT DOCUMENTS 5,585,922 A 12/1996 Sueyoshi
5,870,221 A 2/1999 Goossen
(Continued)

FOREIGN PATENT DOCUMENTS

CN 1776476 A 5/2006
CN 101285771 A 10/2008
(Continued)

OTHER PUBLICATIONS

International Preliminary Report on Patentability dated Jan. 16, 2020 for PCT/JP2018/025633.
(Continued)

*Primary Examiner* — Jonathan M Hansen
(74) *Attorney, Agent, or Firm* — Faegre Drinker Biddle & Reath LLP

(57) ABSTRACT

An optical module includes a mirror unit and a beam splitter unit. The mirror unit includes a base with a main surface, a movable mirror, a first fixed mirror, and a drive unit. The beam splitter unit constitutes a first interference optical system for measurement light along with the movable mirror and the first fixed mirror. A mirror surface of the movable mirror and a mirror surface of the first fixed mirror follow a plane parallel to the main surface and face one side in a first direction perpendicular to the main surface. The movable mirror, the drive unit, and at least a part of an optical path between the beam splitter unit and the first fixed mirror are disposed in an airtight space.

7 Claims, 20 Drawing Sheets

(51) Int. Cl.
  *B81B 3/00*    (2006.01)
  *G01J 3/02*    (2006.01)
  *G01J 3/10*    (2006.01)
  *G01J 3/14*    (2006.01)
  *G01J 3/45*    (2006.01)
  *G02B 7/182*   (2021.01)
  *G02B 27/14*   (2006.01)
  *G01J 3/453*   (2006.01)

(52) U.S. Cl.
  CPC .......... *G01B 9/02049* (2013.01); *G01J 3/021* (2013.01); *G01J 3/0202* (2013.01); *G01J 3/0237* (2013.01); *G01J 3/108* (2013.01); *G01J 3/14* (2013.01); *G01J 3/45* (2013.01); *G02B 7/182* (2013.01); *G02B 26/0816* (2013.01); *G02B 26/0833* (2013.01); *G02B 26/0841* (2013.01); *G02B 27/144* (2013.01); *B81B 2201/042* (2013.01); *B81B 2203/0154* (2013.01); *G01B 2290/25* (2013.01); *G01B 2290/35* (2013.01); *G01J 3/4532* (2013.01); *G01J 3/4535* (2013.01); *G01J 2003/104* (2013.01)

(58) Field of Classification Search
  CPC . B81B 3/0021; B81B 3/007; B81B 2201/042; B81B 2203/0154; B81B 2201/033; B81B 2203/053; G01J 3/0202; G01J 3/021; G01J 3/0237; G01J 3/108; G01J 3/14; G01J 3/45; G01J 3/4532; G01J 3/4535; G01J 2003/104; G01J 3/06
  See application file for complete search history.

(56) References Cited

U.S. PATENT DOCUMENTS

| | | | |
|---|---|---|---|
| 6,392,807 B1 | 5/2002 | Barbarossa et al. | |
| 6,535,290 B1 | 3/2003 | Spanner et al. | |
| 6,552,801 B1 | 4/2003 | Akikuni et al. | |
| 8,981,298 B2 | 3/2015 | Wagner et al. | |
| 2002/0135850 A1 | 9/2002 | Hagelin et al. | |
| 2002/0167730 A1 | 11/2002 | Needham et al. | |
| 2005/0099665 A1 | 5/2005 | Lee et al. | |
| 2005/0275847 A1 | 12/2005 | Moshe | |
| 2005/0280331 A1 | 12/2005 | Wu et al. | |
| 2006/0238768 A1 | 10/2006 | Brorson et al. | |
| 2007/0216907 A1 | 9/2007 | Wang et al. | |
| 2008/0014658 A1 | 1/2008 | Neubert et al. | |
| 2008/0024767 A1 | 1/2008 | Seitz | |
| 2008/0187325 A1 | 8/2008 | McCallion et al. | |
| 2008/0284078 A1 | 11/2008 | Wolter et al. | |
| 2009/0002805 A1* | 1/2009 | Yang ............. | G02B 26/0841 359/292 |
| 2009/0051874 A1 | 2/2009 | Masunishi et al. | |
| 2009/0153844 A1 | 6/2009 | Peter et al. | |
| 2009/0262346 A1 | 10/2009 | Egloff et al. | |
| 2010/0067022 A1 | 3/2010 | Nebosis et al. | |
| 2010/0208347 A1 | 8/2010 | Kouma et al. | |
| 2010/0238456 A1 | 9/2010 | Speake et al. | |
| 2011/0043661 A1 | 2/2011 | Podoleanu | |
| 2011/0090551 A1 | 4/2011 | Pirk et al. | |
| 2011/0285995 A1 | 11/2011 | Tkaczyk et al. | |
| 2012/0085728 A1 | 4/2012 | Chen et al. | |
| 2012/0249984 A1 | 10/2012 | De Boer et al. | |
| 2013/0148966 A1 | 6/2013 | Kurokawa et al. | |
| 2013/0155413 A1 | 6/2013 | Liesener et al. | |
| 2013/0222809 A1 | 8/2013 | Hara | |
| 2013/0278998 A1* | 10/2013 | Stephanou ............ | H01P 1/2088 359/346 |
| 2014/0022546 A1 | 1/2014 | Nagai et al. | |
| 2014/0139924 A1 | 5/2014 | Warashina et al. | |
| 2014/0152993 A1 | 6/2014 | Hirao | |
| 2014/0192365 A1 | 7/2014 | Mortada et al. | |
| 2014/0192412 A1 | 7/2014 | Imai | |
| 2014/0234179 A1 | 8/2014 | Bita | |
| 2015/0168215 A1 | 6/2015 | Day et al. | |
| 2015/0329356 A1 | 11/2015 | Han et al. | |
| 2015/0346479 A1 | 12/2015 | Hirokubo et al. | |
| 2016/0231172 A1 | 8/2016 | Medhat et al. | |
| 2017/0018908 A1 | 1/2017 | Nakanishi | |
| 2017/0357075 A1 | 12/2017 | Uchino | |
| 2017/0363469 A1 | 12/2017 | Sabry et al. | |
| 2019/0033136 A1 | 1/2019 | Warashina et al. | |
| 2021/0302717 A1* | 9/2021 | Man ................. | G02B 26/0833 |

FOREIGN PATENT DOCUMENTS

| | | |
|---|---|---|
| CN | 101583857 A | 11/2009 |
| CN | 101655602 A | 2/2010 |
| CN | 101786592 A | 7/2010 |
| CN | 101871816 A | 10/2010 |
| CN | 102227667 A | 10/2011 |
| CN | 102445725 A | 5/2012 |
| CN | 102735163 A | 10/2012 |
| CN | 102759402 A | 10/2012 |
| CN | 103076090 A | 5/2013 |
| CN | 103288034 A | 9/2013 |
| CN | 103547528 A | 1/2014 |
| CN | 103885177 A | 6/2014 |
| CN | 103913235 A | 7/2014 |
| CN | 104034422 A | 9/2014 |
| CN | 104048759 A | 9/2014 |
| CN | 105103030 A | 11/2015 |
| CN | 105492879 A | 4/2016 |
| CN | 205262613 U | 5/2016 |
| CN | 105890758 A | 8/2016 |
| CN | 106500591 A | 3/2017 |
| DE | 102006032267 A1 | 5/2007 |
| DE | 102008019600 A1 | 10/2009 |
| EP | 0491435 A2 | 6/1992 |
| EP | 1193523 A2 | 4/2002 |
| EP | 2157467 A2 | 2/2010 |
| EP | 2778743 A1 | 9/2014 |
| GB | 2163548 A | 2/1986 |
| GB | 2344168 A | 5/2000 |
| JP | H03-24440 A | 2/1991 |
| JP | H04-323502 A | 11/1992 |
| JP | H05-172738 A | 7/1993 |
| JP | H07-190712 A | 7/1995 |
| JP | H10-206458 A | 8/1998 |
| JP | H10-253912 A | 9/1998 |
| JP | H10-281719 A | 10/1998 |
| JP | H11-183116 A | 7/1999 |
| JP | 2001-296483 A | 10/2001 |
| JP | 2004-050305 A | 2/2004 |
| JP | 2004-198519 A | 7/2004 |
| JP | 2004-233412 A | 8/2004 |
| JP | 2004-255487 A | 9/2004 |
| JP | 2005-055670 A | 3/2005 |
| JP | 2005-223111 A | 8/2005 |
| JP | 2005-292033 A | 10/2005 |
| JP | 2005-309099 A | 11/2005 |
| JP | 2006-343481 A | 12/2006 |
| JP | 2007-21044 A | 2/2007 |
| JP | 2007-042786 A | 2/2007 |
| JP | 2007-155965 A | 6/2007 |
| JP | 2008-145839 A | 6/2008 |
| JP | 2008-233405 A | 10/2008 |
| JP | 2009-42456 A | 2/2009 |
| JP | 2009-093105 A | 4/2009 |
| JP | 2010-054944 A | 3/2010 |
| JP | 2010-096997 A | 4/2010 |
| JP | 2010-512548 A | 4/2010 |
| JP | 2010-128116 A | 6/2010 |
| JP | 2010-170029 A | 8/2010 |
| JP | 2010-184334 A | 8/2010 |
| JP | 2011-080854 A | 4/2011 |
| JP | 2012-042739 A | 3/2012 |
| JP | 2012-098505 A | 5/2012 |
| JP | 2012-107962 A | 6/2012 |
| JP | 2012-145675 A | 8/2012 |
| JP | 2012-524295 A | 10/2012 |

(56) References Cited

FOREIGN PATENT DOCUMENTS

| | | |
|---|---|---|
| JP | 2012-240129 A | 12/2012 |
| JP | 2012-242450 A | 12/2012 |
| JP | 2013-178392 A | 9/2013 |
| JP | 2014-048366 A | 3/2014 |
| JP | 2016-012042 A | 1/2015 |
| JP | 2015-32739 A | 2/2015 |
| JP | 2015-143868 A | 8/2015 |
| JP | 2015-148781 A | 8/2015 |
| JP | 2015-184592 A | 10/2015 |
| JP | 2015-225153 A | 12/2015 |
| JP | 2016-90250 A | 5/2016 |
| JP | 2016-515946 | 6/2016 |
| JP | 2017-097304 A | 6/2017 |
| JP | 2017-194685 A | 10/2017 |
| JP | 6461446 B1 | 1/2019 |
| TW | 201128224 A | 8/2011 |
| TW | 201210308 A | 3/2012 |
| WO | WO 03/085371 A2 | 10/2003 |
| WO | WO 2008/071172 A1 | 6/2008 |
| WO | WO 2010/121185 A1 | 10/2010 |
| WO | WO 2010/122879 A1 | 10/2010 |
| WO | WO 2011/037015 A1 | 3/2011 |
| WO | WO 2011/037547 A2 | 3/2011 |
| WO | WO 2011/061514 A1 | 5/2011 |
| WO | WO 2012/157357 A1 | 11/2012 |
| WO | WO 2012/164810 A1 | 12/2012 |
| WO | WO 2014/117158 A1 | 7/2014 |
| WO | WO 2016/007272 A1 | 1/2016 |
| WO | WO 2016/080317 A1 | 5/2016 |
| WO | WO 2016/166872 A1 | 10/2016 |
| WO | WO 2017/087061 A1 | 5/2017 |
| WO | WO 2017/135357 A1 | 8/2017 |

OTHER PUBLICATIONS

International Preliminary Report on Patentability dated Jan. 16, 2020 for PCT/JP2018/025641.
International Preliminary Report on Patentability dated Jan. 16, 2020 for PCT/JP2018/025644.
International Preliminary Report on Patentability dated Jan. 16, 2020 for PCT/JP2018/025648.
International Preliminary Report on Patentability dated Jan. 16, 2020 for PCT/JP2018/025642.
International Preliminary Report on Patentability dated Jan. 16, 2020 for PCT/JP2018/025645.
International Preliminary Report on Patentability dated Jan. 16, 2020 for PCT/JP2018/025646.
Lu Anjiang et al., "Fourier transform infrared spectrometer based on electro-thermal MEMS micro-mirror", Infrared and Laser Engineering, vol. 45, No. 5, May 2016.
Wojciech J. Waleckil et al., "Novel combined low-coherence interferometry spectrally resolved reflectometry compatible with high-resolution Raman spectroscopy for nondestructive characterization of MEMS structures", Conference on Reliability, Packaging, Testing, and Characterization of MEMS/MOEMS V, Jan. 26, 2006.

* cited by examiner (a)

(b)

OPTICAL MODULE

TECHNICAL FIELD

The present disclosure relates to an optical module.

BACKGROUND ART

An optical module in which an interference optical system is formed on a silicon on insulator (SOI) substrate by a micro electro mechanical systems (MEMS) technology is known (for example, see Patent Literature 1). Such an optical module is gaining attention in that this optical module can provide a Fourier transform infrared spectrometer (FTIR) realizing a highly accurate optical arrangement.

CITATION LIST

Patent Literature

Patent Literature 1: Japanese Unexamined Patent Publication No. 2012-524295

SUMMARY OF INVENTION

Technical Problem

However, the optical module as described above has the following problems, for example, in that the size of a mirror surface of a movable mirror is dependent on the level of deep drilling on the SOI substrate. That is, since the level of deep drilling on the SOI substrate is about 500 μm to maximum, there is a limitation in the improvement of the sensitivity of the FTIR due to an increase in the size of the mirror surface of the movable mirror. On the other hand, when the movable mirror increases in size as the mirror surface increases in size, there is concern that the movable performance of the movable mirror is deteriorated or the entire module increases in size.

An object of the present disclosure is to provide an optical module capable of suppressing deterioration in the movable performance of the movable mirror and an increase in the size of the entire module while enlarging the mirror surface of the movable mirror.

Solution to Problem

An optical module of an aspect of the present disclosure includes: a mirror unit; and a beam splitter unit, in which the mirror unit includes a base which includes a main surface, a movable mirror which includes a mirror surface following a plane parallel to the main surface and is supported by the base so as to be movable along a first direction perpendicular to the main surface, a first fixed mirror which includes a mirror surface following a plane parallel to the main surface and of which a position with respect to the base is fixed, and a drive unit which moves the movable mirror along the first direction, in which the beam splitter unit constitutes a first interference optical system for measurement light along with the movable mirror and the first fixed mirror, in which the mirror surface of the movable mirror and the mirror surface of the first fixed mirror face one side in the first direction, and in which in the mirror unit, the movable mirror, the drive unit, and at least a part of an optical path between the beam splitter unit and the first fixed mirror are disposed in an airtight space.

In the optical module, the movable mirror includes a mirror surface following a plane parallel to the main surface of the base. Accordingly, the mirror surface of the movable mirror can be enlarged. Further, in the mirror unit, the movable mirror and the drive unit are disposed in the airtight space. Accordingly, since the drive unit moving the movable mirror is hardly influenced by the external environment, it is possible to suppress deterioration in the movable performance of the movable mirror. Moreover, the mirror surface of the movable mirror and the mirror surface of the first fixed mirror face one side in the first direction. Accordingly, it is possible to suppress the height of the mirror unit in the first direction as compared with, for example, a positional relationship in which the mirror surface of the movable mirror and the mirror surface of the first fixed mirror are orthogonal to each other. Moreover, at least a part of the optical path between the beam splitter unit and the first fixed mirror is disposed in the airtight space. Accordingly, it is possible to suppress the width of the mirror unit in a direction perpendicular to the first direction. As described above, according to the optical module, it is possible to suppress deterioration in the movable performance of the movable mirror and an increase in the size of the entire module while enlarging the mirror surface of the movable mirror.

In the optical module of an aspect of the present disclosure, the mirror unit may further include a support body having optical transparency, the base may be supported by the support body, the first fixed mirror may be disposed on a surface at the side opposite to the base in the support body, and the support body may correct an optical path difference between a first optical path between the beam splitter unit and the movable mirror and a second optical path between the beam splitter unit and the first fixed mirror. Accordingly, the interference light of the measurement light can be easily and highly accurately obtained. Moreover, a light transmitting member correcting the optical path difference does not need to be provided separately.

In the optical module of an aspect of the present disclosure, the mirror unit may further include a package which accommodates the base, the movable mirror, the first fixed mirror, the drive unit, and the support body, the package may include a wall having optical transparency, the beam splitter unit may be supported by the wall, and the airtight space may be formed by the package. Accordingly, both of the formation of the airtight space and the support of the beam splitter unit can be realized by the simple package including the wall having optical transparency.

In the optical module of an aspect of the present disclosure, the mirror unit may further include a package which accommodates the base, the movable mirror, the first fixed mirror, the drive unit, and the support body, the package may include a wall provided with at least one opening through which the first optical path and the second optical path pass, the beam splitter unit may be supported by the wall while blocking the at least one opening, and the airtight space may be formed by the package and the beam splitter unit. Accordingly, both of the formation of the airtight space and the support of the beam splitter unit can be realized by the simple package including the wall provided with at least one opening.

In the optical module of an aspect of the present disclosure, the mirror unit may further include a package which accommodates the base, the movable mirror, the first fixed mirror, the drive unit, and the support body and a support structure which supports the beam splitter unit, the package may include a wall having optical transparency, the beam splitter unit may be supported by the support structure while being separated from the wall, and the airtight space may be formed by the package. Accordingly, since the support structure supporting the beam splitter unit is provided separately from the package, it is possible to improve the degree of freedom of the layout of the beam splitter unit.

In the optical module of an aspect of the present disclosure, the mirror unit may further include a wall having optical transparency, the beam splitter unit may be supported by the wall, and the airtight space may be formed by the base, the support body, and the wall. Accordingly, since the base and the support body function as a part of the package forming the airtight space, it is possible to suppress an increase in the size of the entire module as compared with, for example, a case in which the package accommodating the base and the support body is provided separately.

In the optical module of an aspect of the present disclosure, the mirror unit may further include a wall provided with at least one opening through which the first optical path and the second optical path pass, the beam splitter unit may be supported by the wall while blocking the at least one opening, and the airtight space may be formed by the base, the support body, the wall, and the beam splitter unit. Accordingly, since the base and the support body function as a part of the package forming the airtight space, it is possible to suppress an increase in the size of the entire module as compared with, for example, a case in which the package accommodating the base and the support body is provided separately.

In the optical module of an aspect of the present disclosure, the mirror unit may further include a wall having optical transparency and a support structure supporting the beam splitter unit, the beam splitter unit may be supported by the support structure while being separated from the wall, and the airtight space may be formed by the base, the support body, and the wall. Accordingly, since the base and the support body function as a part of the package forming the airtight space, it is possible to suppress an increase in the size of the entire module as compared with, for example, a case in which the package accommodating the base and the support body is provided separately. Further, since the mirror unit includes the support structure supporting the beam splitter unit separately from the wall having optical transparency, it is possible to improve the degree of freedom of the layout of the beam splitter unit.

In the optical module of an aspect of the present disclosure, in the mirror unit, the mirror surface of the movable mirror and the mirror surface of the first fixed mirror may be disposed along the same plane parallel to the main surface, and the beam splitter unit may correct an optical path difference between a first optical path between the beam splitter unit and the movable mirror and a second optical path between the beam splitter unit and the first fixed mirror. Accordingly, it is possible to suppress the height of the mirror unit in the first direction as compared with, for example, a case in which the light transmitting member correcting the optical path difference is provided separately.

In the optical module of an aspect of the present disclosure, the mirror unit may further include a package which accommodates the base, the movable mirror, the first fixed mirror, and the drive unit, the package may include a wall having optical transparency, the beam splitter unit may be supported by the wall, and the airtight space may be formed by the package. Accordingly, both of the formation of the airtight space and the support of the beam splitter unit can be realized by the simple package including the wall having optical transparency.

In the optical module of an aspect of the present disclosure, the mirror unit may further include a package which accommodates the base, the movable mirror, the first fixed mirror, and the drive unit, the package may include a wall provided with at least one opening through which the first optical path and the second optical path pass, the beam splitter unit may be supported by the wall while blocking the at least one opening, and the airtight space may be formed by the package and the beam splitter unit. Accordingly, both of the formation of the airtight space and the support of the beam splitter unit can be realized by the simple package including the wall provided with at least one opening.

In the optical module of an aspect of the present disclosure, the mirror unit may further include a package which accommodates the base, the movable mirror, the first fixed mirror, and the drive unit, the package may include a wall having optical transparency and a support structure supporting the beam splitter unit, the beam splitter unit may be supported by the support structure while being separated from the wall, and the airtight space may be formed by the package. Accordingly, since the package includes the support structure supporting the beam splitter unit separately from the wall having optical transparency, it is possible to improve the degree of freedom of the layout of the beam splitter unit.

In the optical module of an aspect of the present disclosure, the mirror unit may further include a wall having optical transparency, the beam splitter unit may be supported by the wall, and the airtight space may be formed by the base and the wall. Accordingly, since the base functions as a part of the package forming the airtight space, it is possible to suppress an increase in the size of the entire module as compared with, for example, a case in which the package accommodating the base is provided separately.

In the optical module of an aspect of the present disclosure, the mirror unit may further include a wall provided with at least one opening through which the first optical path and the second optical path pass, the beam splitter unit may be supported by the wall while blocking the at least one opening, and the airtight space may be formed by the base, the wall, and the beam splitter unit. Accordingly, since the base functions as a part of the package forming the airtight space, it is possible to suppress an increase in the size of the entire module as compared with, for example, a case in which the package accommodating the base is provided separately.

In the optical module of an aspect of the present disclosure, the mirror unit may further include a wall having optical transparency and a support structure supporting the beam splitter unit, the beam splitter unit may be supported by the support structure while being separated from the wall, and the airtight space may be formed by the base and the wall. Accordingly, since the base functions as a part of the package forming the airtight space, it is possible to suppress an increase in the size of the entire module as compared with, for example, a case in which the package accommodating the base is provided separately. Further, since the mirror unit includes the support structure supporting the beam splitter unit separately from the wall having optical transparency, it is possible to improve the degree of freedom of the layout of the beam splitter unit.

The optical module of an aspect of the present disclosure may further include: a measurement light incident unit which is disposed so that the measurement light is incident from the outside to the first interference optical system; and a measurement light emission unit which is disposed so that the measurement light is emitted from the first interference optical system to the outside. Accordingly, it is possible to obtain the FTIR including the measurement light incident unit and the measurement light emission unit.

In the optical module of an aspect of the present disclosure, the beam splitter unit may constitute a second interference optical system for laser light along with the movable mirror and the first fixed mirror. Accordingly, since the interference light of the laser light is detected, it is possible to highly accurately measure the position of the mirror surface of the movable mirror. Further, the beam splitter unit constitutes the first interference optical system for the measurement light and the second interference optical system for the laser light along with the movable mirror and the first fixed mirror. For that reason, it is possible to decrease the number of parts of the mirror unit.

In the optical module of an aspect of the present disclosure, the mirror unit may further include a second fixed mirror which includes a mirror surface following a plane parallel to the main surface and of which a position with respect to the base is fixed, the beam splitter unit may constitute a second interference optical system for laser light along with the movable mirror and the second fixed mirror, the mirror surface of the second fixed mirror may face the one side in the first direction, and in the mirror unit, the movable mirror, the drive unit, at least a part of an optical path between the beam splitter unit and the first fixed mirror, and at least a part of an optical path between the beam splitter unit and the second fixed mirror may be disposed in the airtight space. Accordingly, since the interference light of the laser light is detected, it is possible to highly accurately measure the position of the mirror surface of the movable mirror. Further, the mirror surface of the second fixed mirror faces one side in the first direction similarly to the mirror surface of the first fixed mirror. For that reason, it is possible to suppress the height of the mirror unit in the first direction as compared with, for example, a positional relationship in which the mirror surface of the movable mirror and the mirror surface of the second fixed mirror are orthogonal to each other. Moreover, at least a part of the optical path between the beam splitter unit and the second fixed mirror is disposed in the airtight space similarly to at least a part of the optical path between the beam splitter unit and the first fixed mirror. Accordingly, it is possible to suppress the width of the mirror unit in a direction perpendicular to the first direction.

The optical module of an aspect of the present disclosure may further include: a light source which generates the laser light to be incident to the second interference optical system; and a photodetector which detects the laser light emitted from the second interference optical system. Accordingly, since it is possible to highly accurately measure the position of the movable mirror by detecting the laser light, it is possible to obtain a highly accurate FTIR.

In the optical module of an aspect of the present disclosure, the base, a movable portion of the movable mirror, and the drive unit may be configured by an SOI substrate. Accordingly, a configuration for reliably moving the movable mirror can be appropriately realized by the SOI substrate.

Advantageous Effects of Invention

According to the present disclosure, it is possible to provide an optical module capable of suppressing deterioration in the movable performance of the movable mirror and an increase in the size of the entire module while enlarging the mirror surface of the movable mirror.

DESCRIPTION OF EMBODIMENTS

Figure 1:
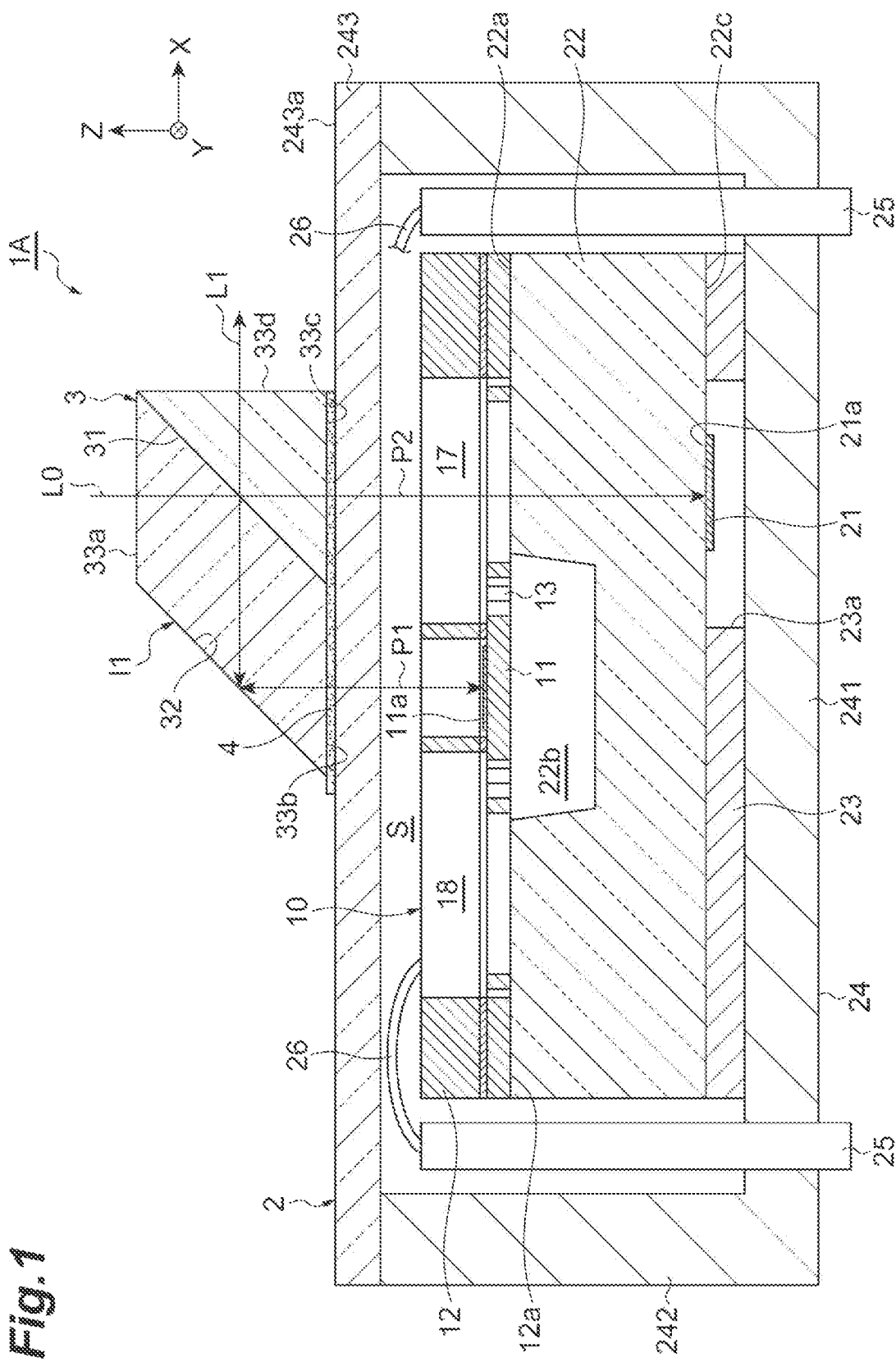
FIG. 1 is a longitudinal sectional view of an optical module of a first embodiment.

Hereinafter, embodiments of the present disclosure will be described in detail with reference to the drawings. Furthermore, in the drawings, the same reference numerals will be given to the same or corresponding parts and a redundant description thereof will be omitted.

First Embodiment

[Configuration of Optical Module]

As illustrated in FIG. 1, an optical module 1A includes a mirror unit 2 and a beam splitter unit 3. The mirror unit 2 includes an optical device 10 and a fixed mirror (a first fixed mirror) 21. The optical device 10 includes a movable mirror 11. In the optical module 1A, the beam splitter unit 3, the movable mirror 11, and the fixed mirror 21 constitute an interference optical system (a first interference optical system) I1 for measurement light L0. Here, the interference optical system I1 is a Michelson interference optical system.

The optical device 10 includes a base 12, a drive unit 13, a first optical function portion 17, and a second optical function portion 18 in addition to the movable mirror 11. The base 12 includes a main surface 12a. The movable mirror 11 includes a mirror surface 11a following a plane parallel to the main surface 12a. The movable mirror 11 is supported by the base 12 so as to be movable along a Z-axis direction perpendicular to the main surface 12a (a direction parallel to the Z axis, a first direction). The drive unit 13 moves the movable mirror 11 along the Z-axis direction. The first optical function portion 17 is disposed at one side of the movable mirror 11 in an X-axis direction perpendicular to the Z-axis direction (a direction parallel to the X axis, a second direction) when viewed from the Z-axis direction. The second optical function portion 18 is disposed at the other side of the movable mirror 11 in the X-axis direction when viewed from the Z-axis direction. The first optical function portion 17 and the second optical function portion 18 are respectively light passage opening portions provided in the base 12 and are opened to one side and the other side in the Z-axis direction.

The fixed mirror 21 includes a mirror surface 21a following a plane parallel to the main surface 12a. The position of the fixed mirror 21 with respect to the base 12 is fixed. In the mirror unit 2, the mirror surface 11a of the movable mirror 11 and the mirror surface 21a of the fixed mirror 21 face one side in the Z-axis direction (the side of the beam splitter unit 3).

The mirror unit 2 includes a support body 22, a sub-mount 23, and a package 24 in addition to the optical device 10 and the fixed mirror 21. The package 24 accommodates the optical device 10 (the movable mirror 11, the base 12, and the drive unit 13), the fixed mirror 21, the support body 22, and the sub-mount 23. The package 24 includes a bottom wall 241, a side wall 242, and a ceiling wall (wall) 243. The package 24 is formed in, for example, a rectangular parallelepiped box shape. The package 24 has, for example, a size of about 30×25×10 (thickness) mm. The bottom wall 241 and the side wall 242 are integrally formed with each other. The ceiling wall 243 faces the bottom wall 241 in the Z-axis direction and is air-tightly fixed to the side wall 242. The ceiling wall 243 has optical transparency with respect to the measurement light L0. In the mirror unit 2, an airtight space S is formed by the package 24. The airtight space S is, for example, an airtight space in which a high degree of vacuum is maintained or an airtight space filled with an inert gas such as nitrogen.

The support body 22 is fixed to the inner surface of the bottom wall 241 through the sub-mount 23. The support body 22 is formed in, for example, a rectangular plate shape. The support body 22 has optical transparency with respect to the measurement light L0. The base 12 of the optical device 10 is fixed to a surface 22a at the side opposite to the sub-mount 23 in the support body 22. That is, the base 12 is supported by the support body 22. A concave portion 22b is formed on the surface 22a of the support body 22 and a gap (a part of the airtight space S) is formed between the optical device 10 and the ceiling wall 243. Accordingly, the contact of the movable mirror 11 and the drive unit 13 with respect to the support body 22 and the ceiling wall 243 is prevented when the movable mirror 11 is moved along the Z-axis direction.

An opening 23a is formed in the sub-mount 23. The fixed mirror 21 is disposed on a surface 22c at the side of the sub-mount 23 in the support body 22 so as to be located within the opening 23a. That is, the fixed mirror 21 is disposed on the surface 22c at the side opposite to the base 12 in the support body 22. The fixed mirror 21 is disposed at one side of the movable mirror 11 in the X-axis direction when viewed from the Z-axis direction. The fixed mirror 21 overlaps the first optical function portion 17 of the optical device 10 when viewed from the Z-axis direction.

The mirror unit 2 further includes a plurality of lead pins 25 and a plurality of wires 26. Each lead pin 25 is air-tightly fixed to the bottom wall 241 while penetrating the bottom wall 241. Each lead pin 25 is electrically connected to the drive unit 13 through a wire 26. In the mirror unit 2, an electric signal for moving the movable mirror 11 along the Z-axis direction is applied to the drive unit 13 through the plurality of lead pins 25 and the plurality of wires 26.

The beam splitter unit 3 is supported by the ceiling wall 243 of the package 24. Specifically, the beam splitter unit 3 is fixed to a surface 243a at the side opposite to the optical device 10 in the ceiling wall 243 by an optical resin 4. The optical resin 4 has optical transparency with respect to the measurement light L0.

The beam splitter unit 3 includes a half mirror surface 31, a total reflection mirror surface 32, and a plurality of optical surface 33a, 33b, 33c, and 33d. The beam splitter unit 3 is configured by bonding a plurality of optical blocks. The half mirror surface 31 is formed by, for example, a dielectric multilayer. The total reflection mirror surface 32 is formed by, for example, a metal film.

The optical surface 33a is, for example, a surface perpendicular to the Z-axis direction and overlaps the first optical function portion 17 of the optical device 10 and the mirror surface 21a of the fixed mirror 21 when viewed from the Z-axis direction. The measurement light L0 which is incident along the Z-axis direction is transmitted through the optical surface 33a.

The half mirror surface 31 is, for example, a surface inclined by 45° with respect to the optical surface 33a and overlaps the first optical function portion 17 of the optical device 10 and the mirror surface 21a of the fixed mirror 21 when viewed from the Z-axis direction. The half mirror surface 31 reflects a part of the measurement light L0, which is incident to the optical surface 33a along the Z-axis direction, along the X-axis direction and transmits the remaining part of the measurement light L0 toward the fixed mirror 21 along the Z-axis direction.

The total reflection mirror surface 32 is a surface parallel to the half mirror surface 31, overlaps the mirror surface 11a of the movable mirror 11 when viewed from the Z-axis direction, and overlaps the half mirror surface 31 when viewed from the X-axis direction. The total reflection mirror surface 32 reflects a part of the measurement light L0 reflected by the half mirror surface 31 toward the movable mirror 11 along the Z-axis direction.

The optical surface 33b is a surface parallel to the optical surface 33a and overlaps the mirror surface 11a of the movable mirror 11 when viewed from the Z-axis direction. The optical surface 33b transmits a part of the measurement light L0 reflected by the total reflection mirror surface 32 toward the movable mirror 11 along the Z-axis direction.

The optical surface 33c is a surface parallel to the optical surface 33a and overlaps the mirror surface 21a of the fixed mirror 21 when viewed from the Z-axis direction. The optical surface 33c transmits the remaining part of the measurement light L0 transmitted through the half mirror surface 31 toward the fixed mirror 21 along the Z-axis direction.

The optical surface 33d is, for example, a surface perpendicular to the X-axis direction and overlaps the half mirror surface 31 and the total reflection mirror surface 32 when viewed from the X-axis direction. The optical surface 33d transmits the measurement light L1 along the X-axis direction. The measurement light L1 is the interference light of a part of the measurement light L0 sequentially reflected by the mirror surface 11a of the movable mirror 11 and the total reflection mirror surface 32 and transmitted through the half mirror surface 31 and the remaining part of the measurement light L0 sequentially reflected by the mirror surface 21a of the fixed mirror 21 and the half mirror surface 31.

In the optical module 1A with the above-described configuration, when the measurement light L0 is incident from the outside of the optical module 1A to the beam splitter unit 3 through the optical surface 33a, a part of the measurement light L0 is sequentially reflected by the half mirror surface 31 and the total reflection mirror surface 32 and travels toward the mirror surface 11a of the movable mirror 11. Then, a part of the measurement light L0 is reflected by the mirror surface 11a of the movable mirror 11, travels in the reverse direction on the same optical path (an optical path P1 to be described later), and is transmitted through the half mirror surface 31 of the beam splitter unit 3.

Meanwhile, the remaining part of the measurement light L0 is transmitted through the half mirror surface 31 of the beam splitter unit 3, passes through the first optical function portion 17, is further transmitted through the support body 22, and travels toward the mirror surface 21a of the fixed mirror 21. Then, the remaining part of the measurement light L0 is reflected by the mirror surface 21a of the fixed mirror 21, travels in the reverse direction on the same optical path (an optical path P2 to be described later), and is reflected by the half mirror surface 31 of the beam splitter unit 3.

A part of the measurement light L0 transmitted through the half mirror surface 31 of the beam splitter unit 3 and the remaining part of the measurement light L0 reflected by the half mirror surface 31 of the beam splitter unit 3 become the measurement light L1 that is the interference light and the measurement light L1 is emitted from the beam splitter unit 3 to the outside of the optical module 1A through the optical surface 33d. According to the optical module 1A, since it is possible to reciprocate the movable mirror 11 at a high speed along the Z-axis direction, a small and highly accurate FTIR can be provided.

The support body 22 corrects an optical path difference between an optical path (a first optical path) P1 between the beam splitter unit 3 and the movable mirror 11 and an optical path (a second optical path) P2 between the beam splitter unit 3 and the fixed mirror 21. Specifically, the optical path P1 is an optical path extending from the half mirror surface 31 to the mirror surface 11a of the movable mirror 11 located at the reference position through the total reflection mirror surface 32 and the optical surface 33b in a sequential order and is an optical path along which a part of the measurement light L0 travels. The optical path P2 is an optical path extending from the half mirror surface 31 to the mirror surface 21a of the fixed mirror 21 through the optical surface 33c and the first optical function portion 17 in a sequential order and is an optical path along which the remaining part of the measurement light L0 travels. The support body 22 corrects the optical path difference between the optical path P1 and the optical path P2 so that a difference between the optical path length of the optical path P1 (the optical path length considering the refractive index of each medium through which the optical path P1 passes) and the optical path length of the optical path P2 (the optical path length considering the refractive index of each medium through which the optical path P2 passes) decreases. The support body 22 can be formed of, for example, a material having the same optical transparency as that of each of the optical blocks constituting the beam splitter unit 3. In this case, the thickness (the length in the Z-axis direction) of the support body 22 can be the same as the distance between the half mirror surface 31 and the total reflection mirror surface 32 in the X-axis direction. Furthermore, in the mirror unit 2, the movable mirror 11, the drive unit 13, a part of the optical path P1, and a part of the optical path P2 are disposed in the airtight space S.

[Configuration of Optical Device]

Figure 2:
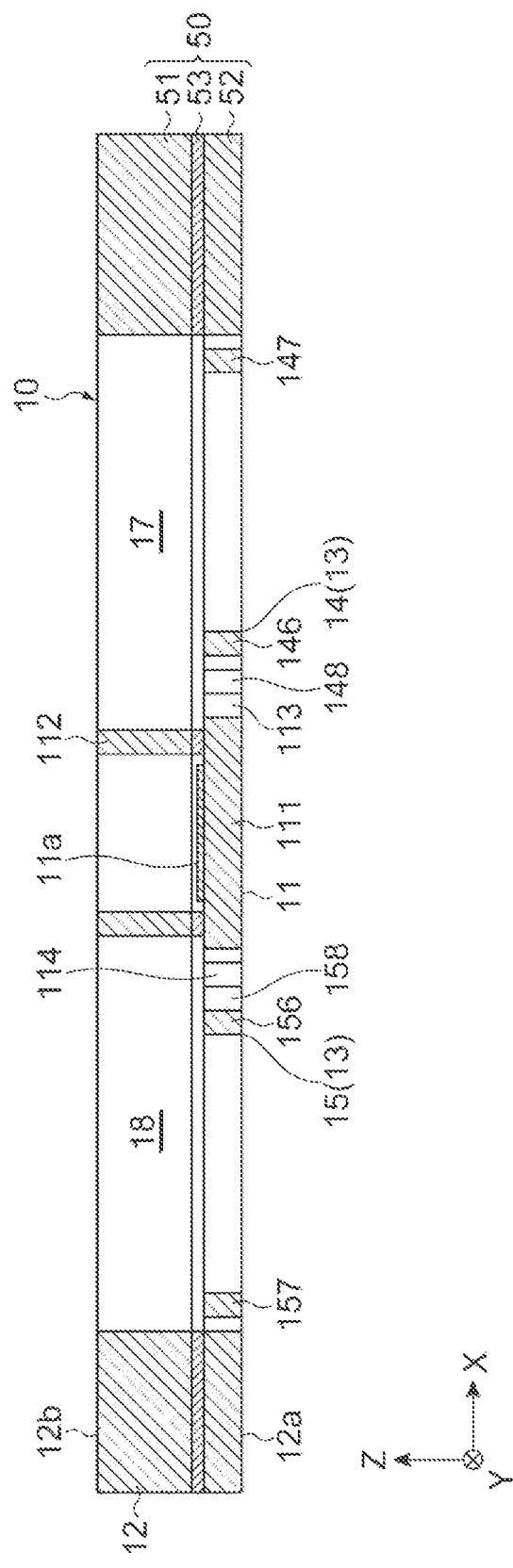
FIG. 2 is a longitudinal sectional view of an optical device included in the optical module illustrated in FIG. 1.
Figure 3:
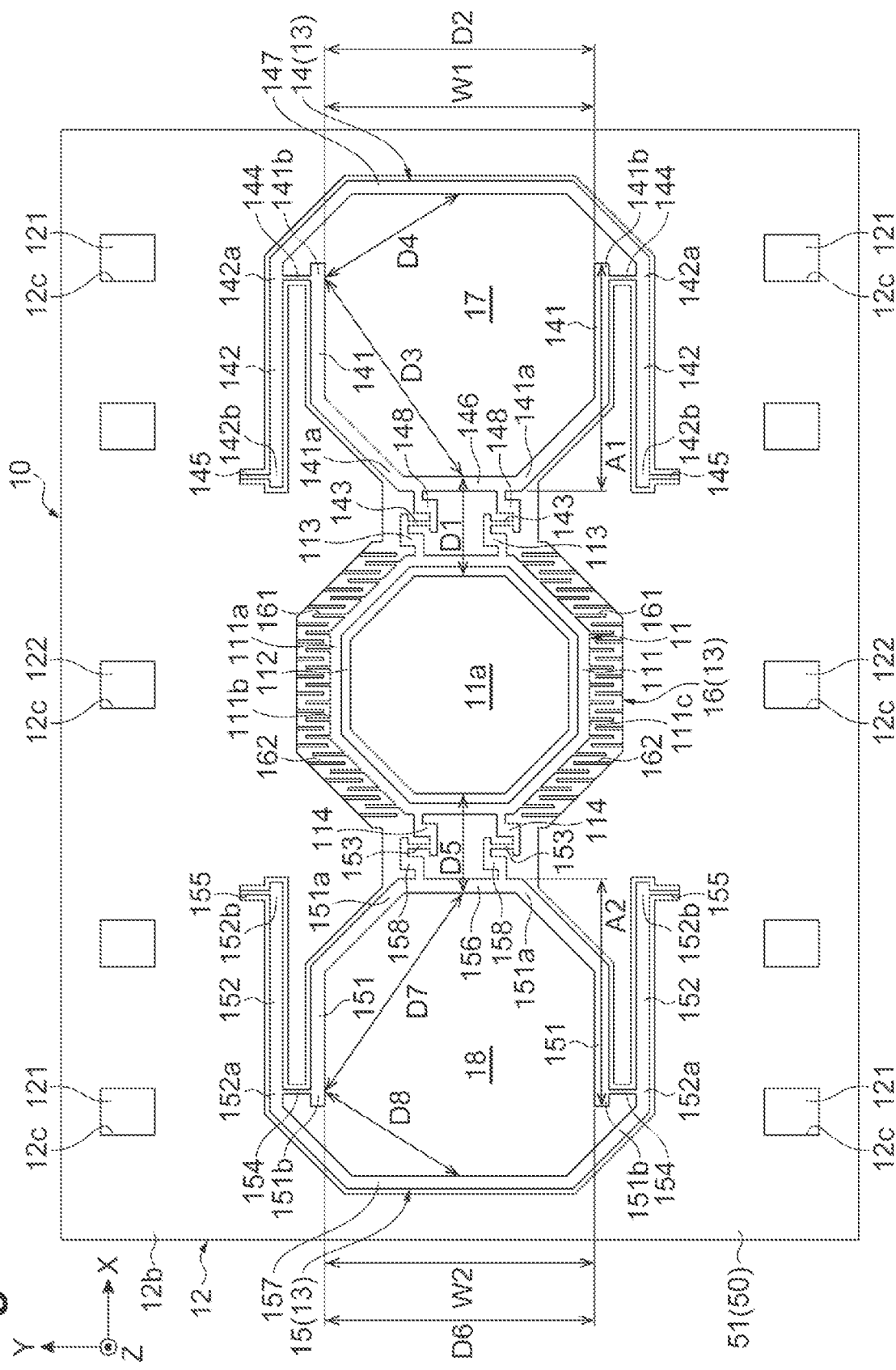
FIG. 3 is a plan view of the optical device illustrated in FIG. 2.

As illustrated in FIGS. 2 and 3, the base 12, the movable portion of the movable mirror 11, the drive unit 13, the first optical function portion 17, and the second optical function portion 18 are configured by an SOI substrate 50. That is, the optical device 10 is formed by the SOI substrate 50. The optical device 10 is formed in, for example, a rectangular plate shape. The optical device 10 has, for example, a size of about 15×10×0.3 (thickness) mm. The SOI substrate 50 includes a support layer 51, a device layer 52, and an intermediate layer 53. Specifically, the support layer 51 is a first silicon layer of the SOI substrate 50. The device layer 52 is a second silicon layer of the SOI substrate 50. The intermediate layer 53 is an insulation layer of the SOI substrate 50 and is disposed between the support layer 51 and the device layer 52. The movable mirror 11 and the drive unit 13 are integrally formed in a part of the device layer 52 by an MEMS technology (patterning and etching).

The base 12 is formed by the support layer 51, the device layer 52, and the intermediate layer 53. The main surface 12a of the base 12 is a surface at the side opposite to the intermediate layer 53 in the device layer 52. A main surface 12b facing the main surface 12a in the base 12 is a surface at the side opposite to the intermediate layer 53 in the support layer 51. In the optical module 1A, the main surface 12a of the base 12 is bonded to the surface 22a of the support body 22 (see FIG. 1).

The movable mirror 11 includes a main body 111 and a wall portion 112 that are movable portions. The main body 111 is formed by the device layer 52. The mirror surface 11a is provided in a surface 111a at the side of the main surface 12b in the main body 111 by forming a metal film. The wall portion 112 is formed by the support layer 51 and the intermediate layer 53. The wall portion 112 is provided in the surface 111a of the main body 111. The wall portion 112 surrounds the mirror surface 11a when viewed from the Z-axis direction. As an example, the wall portion 112 is provided in the surface 111a of the main body 111 so as to follow the outer edge inside the outer edge of the main body 111 when viewed from the Z-axis direction and to follow the outer edge at the outside of the outer edge of the mirror surface 11a when viewed from the Z-axis direction.

The movable mirror 11 further includes a pair of brackets 113 and a pair of brackets 114 that are movable portions. The pair of brackets 113 and the pair of brackets 114 are formed by the device layer 52. The pair of brackets 113 is provided in a region at the side of the first optical function portion 17 in the side surface of the main body 111 so as to protrude toward the first optical function portion 17. Each bracket 113 is bent in a crank shape to the same side when viewed from the Z-axis direction. The pair of brackets 114 is provided in a region at the side of the second optical function portion 18 in the side surface of the main body 111 so as to protrude toward the second optical function portion 18 (the side opposite to the first optical function portion 17). Each bracket 114 is bent in a crank shape to the same side (here, the side opposite to each bracket 113) when viewed from the Z-axis direction.

The drive unit 13 includes a first elastic support portion 14, a second elastic support portion 15, and an actuator 16. The first elastic support portion 14, the second elastic support portion 15, and the actuator 16 are formed by the device layer 52.

The first elastic support portion 14 and the second elastic support portion 15 are connected to the base 12 and the movable mirror 11. The first elastic support portion 14 and the second elastic support portion 15 support the movable mirror 11 so as to be movable along the Z-axis direction.

The first elastic support portion 14 includes a pair of first levers 141, a pair of second levers 142, a plurality of torsion bars 143, 144, and 145, a plurality of links 146 and 147, and a pair of brackets 148. The pair of first levers 141 extends along the main surface 12a of the base 12 from the movable mirror 11 toward both sides of the first optical function portion 17 in a Y-axis direction perpendicular to the Z-axis direction and the X-axis direction (a direction parallel to the Y axis, a third direction). In this embodiment, the pair of first levers 141 extends along the main surface 12a of the base 12 from a gap between the movable mirror 11 and the first optical function portion 17 toward both sides of the first optical function portion 17 in the Y-axis direction. The pair of first levers 141 extends along the edge of the first optical function portion 17 when viewed from the Z-axis direction. The pair of second levers 142 extends along the main surface 12a of the base 12 from both sides of the first optical function portion 17 in the Y-axis direction toward the movable mirror 11. The pair of second levers 142 extends along the X-axis direction outside the pair of first levers 141 when viewed from the Z-axis direction.

The link 146 is laid between end portions 141a at the side of the movable mirror 11 in the first levers 141. The link 147 is laid between end portions 142a at the side opposite to the movable mirror 11 in the second levers 142. Each of the links 146 and 147 extends along the edge of the first optical function portion 17 when viewed from the Z-axis direction. The pair of brackets 148 is provided in a side surface at the side of the movable mirror 11 in the link 146 so as to protrude toward the movable mirror 11. Each bracket 148 is bent in a crank shape to the same side (here, the side opposite to each bracket 113) when viewed from the Z-axis direction. The front end portion of one bracket 148 faces the front end portion of one bracket 113 in the Y-axis direction. The front end portion of the other bracket 148 faces the front end portion of the other bracket 113 in the Y-axis direction.

The torsion bar 143 is laid between the front end portion of one bracket 148 and the front end portion of one bracket 113 and between the front end portion of the other bracket 148 and the front end portion of the other bracket 113. The torsion bar 143 is laid between the bracket 148 and the bracket 113 which are bent in a crank shape to the opposite side. That is, the end portion 141a of each first lever 141 is connected to the movable mirror 11 through the pair of torsion bars 143. The pair of torsion bars 143 is disposed on the same axis parallel to the Y-axis direction.

The torsion bar 144 is laid between the end portion 142a of one second lever 142 and an end portion 141b at the side opposite to the movable mirror 11 in one first lever 141 and between the end portion 142a of the other second lever 142 and the end portion 141b at the side opposite to the movable mirror 11 in the other first lever 141. That is, the end portion 141b of each first lever 141 is connected to the end portion 142a of each second lever 142 through the pair of torsion bars 144. The pair of torsion bars 144 is disposed on the same axis parallel to the Y-axis direction.

The torsion bar 145 is laid between the base 12 and an end portion 142b at the side of the movable mirror 11 in one second lever 142 and between the base 12 and the end portion 142b at the side of the movable mirror 11 in the other second lever 142. That is, the end portion 142b of each second lever 142 is connected to the base 12 through the pair of torsion bars 145. The pair of torsion bars 145 is disposed on the same axis parallel to the Y-axis direction.

The second elastic support portion 15 includes a pair of third levers 151, a pair of fourth levers 152, a plurality of torsion bars 153, 154, and 155, a plurality of links 156 and 157, and a pair of brackets 158. The pair of third levers 151 extends along the main surface 12a of the base 12 from the movable mirror 11 toward both sides of the second optical function portion 18 in the Y-axis direction. In this embodiment, the pair of third levers 151 extends from a gap between the movable mirror 11 and the second optical function portion 18 toward both sides of the second optical function portion 18 in the Y-axis direction. The pair of third levers 151 extends along the edge of the second optical function portion 18 when viewed from the Z-axis direction. The pair of fourth levers 152 extends along the main surface 12a of the base 12 from both sides of the second optical function portion 18 in the Y-axis direction toward the movable mirror 11. The pair of fourth levers 152 extends along the X-axis direction outside the pair of third levers 151 when viewed from the Z-axis direction.

The link 156 is laid between end portions 151a at the side of the movable mirror 11 in the third levers 151. The link 157 is laid between end portions 152a at the side opposite to the movable mirror 11 in the fourth levers 152. Each of the links 156 and 157 extends along the edge of the second optical function portion 18 when viewed from the Z-axis direction. The pair of brackets 158 is provided in a side surface at the side of the movable mirror 11 in the link 156 so as to protrude toward the movable mirror 11. Each bracket 158 is bent in a crank shape to the same side (here, the side opposite to each bracket 114) when viewed from the Z-axis direction. The front end portion of one bracket 158 faces the front end portion of one bracket 114 in the Y-axis direction. The front end portion of the other bracket 158 faces the front end portion of the other bracket 114 in the Y-axis direction.

The torsion bar 153 is laid between the front end portion of one bracket 158 and the front end portion of one bracket 114 and between the front end portion of the other bracket 158 and the front end portion of the other bracket 114. The torsion bar 153 is laid between the bracket 158 and the bracket 114 which are bent in a crank shape to the opposite side. That is, the end portions 151a of the third levers 151 are connected to the movable mirror 11 through the pair of torsion bars 153. The pair of torsion bars 153 is disposed on the same axis parallel to the Y-axis direction.

The torsion bar 154 is laid between the end portion 152a of one fourth lever 152 and an end portion 151b at the side opposite to the movable mirror 11 in one third lever 151 and between the end portion 152a of the other fourth lever 152 and the end portion 151b at the side opposite to the movable mirror 11 in the other third lever 151. That is, the end portion 151b of each third lever 151 is connected to the end portion 152a of each fourth lever 152 through the pair of torsion bars 154. The pair of torsion bars 154 is disposed on the same axis parallel to the Y-axis direction.

The torsion bar 155 is laid between the base 12 and an end portion 152b at the side of the movable mirror 11 in one fourth lever 152 and between the base 12 and the end portion 152b at the side of the movable mirror 11 in the other fourth lever 152. That is, the end portion 152b of each fourth lever 152 is connected to the base 12 through the pair of torsion bars 155. The pair of torsion bars 155 is disposed on the same axis parallel to the Y-axis direction.

The first optical function portion 17 is defined by at least the pair of first levers 141 and the plurality of links 146 and 147. In the first elastic support portion 14, a length A1 of each first lever 141 in the X-axis direction is larger than the shortest distance D1 between the outer edge of the mirror surface 11a and the edge of the first optical function portion 17 (the shortest distance when viewed from the Z-axis direction). A maximum distance D2 between the pair of first levers 141 in the Y-axis direction is the same as a maximum width W1 of the first optical function portion 17 in the Y-axis direction (the maximum width when viewed from the Z-axis direction). A distance D3 from a portion closest to the mirror surface 11a in the edge of the first optical function portion 17 to the end portion 141b of each first lever 141 (the distance when viewed from the Z-axis direction) is larger than a distance D4 from a portion farthest from the mirror surface 11a in the edge of the first optical function portion 17 to the end portion 141b of each first lever 141 (the distance when viewed from the Z-axis direction).

The second optical function portion 18 is defined by at least the pair of third levers 151 and the plurality of links 156 and 157. In the second elastic support portion 15, a length A2 of each third lever 151 in the X-axis direction is larger than the shortest distance D5 between the outer edge of the mirror surface 11a and the edge of the second optical function portion 18 (the shortest distance when viewed from the Z-axis direction). A maximum distance D6 between the pair of third levers 151 in the Y-axis direction is the same as a maximum width W2 of the second optical function portion 18 in the Y-axis direction (the maximum width when viewed from the Z-axis direction). A distance D7 from a portion closest to the mirror surface 11a in the edge of the second optical function portion 18 to the end portion 151b of each third lever 151 (the distance when viewed from the Z-axis direction) is larger than a distance D8 from a portion farthest from the mirror surface 11a in the edge of the second optical function portion 18 to the end portion 151b of each third lever 151 (the distance when viewed from the Z-axis direction).

The first elastic support portion 14 and the second elastic support portion 15 do not have a symmetrical structure with respect to a plane passing through the center of the movable mirror 11 and perpendicular to the X-axis direction and a plane passing through the center of the movable mirror 11 and perpendicular to the Y-axis direction. Here, a portion excluding the pair of brackets 148 in the first elastic support portion 14 and a portion excluding the pair of brackets 158 in the second elastic support portion 15 have a symmetrical structure with respect to a plane passing through the center of the movable mirror 11 and perpendicular to the X-axis direction and a plane passing through the center of the movable mirror 11 and perpendicular to the Y-axis direction.

The actuator 16 moves the movable mirror 11 along the Z-axis direction. The actuator 16 includes a pair of comb electrodes 161 and a pair of comb electrodes 162 disposed along the outer edge of the movable mirror 11. One comb electrode 161 is provided in a region 111b between one bracket 113 and one bracket 114 in the side surface of the main body 111 of the movable mirror 11. The other comb electrode 161 is provided in a region 111c between the other bracket 113 and the other bracket 114 in the side surface of the main body 111 of the movable mirror 11. One comb electrode 162 is provided in a region extending along the region 111b while being separated from the region 111b of the main body 111 in the side surface of the device layer 52 of the base 12. The other comb electrode 162 is provided in a region extending along the region 111c while being separated from the region 111c of the main body 111 in the side surface of the device layer 52 of the base 12. In one comb electrode 161 and one comb electrode 162, each comb finger of one comb electrode 161 is located between respective comb fingers of one comb electrode 162. In the other comb electrode 161 and the other comb electrode 162, each comb finger of the other comb electrode 161 is located between respective comb fingers of the other comb electrode 162.

The base 12 is provided with a plurality of electrode pads 121 and 122. Each of the electrode pads 121 and 122 is formed on the surface of the device layer 52 inside an opening 12c formed in the main surface 12b of the base 12 so as to reach the device layer 52. Each electrode pad 121 is electrically connected to the comb electrode 161 through the first elastic support portion 14 and the main body 111 of the movable mirror 11 or the second elastic support portion 15 and the main body 111 of the movable mirror 11. Each electrode pad 122 is electrically connected to the comb electrode 162 through the device layer 52. The wire 26 is laid between each of the electrode pads 121 and 122 and each lead pin 25.

In the optical device 10 with the above-described configuration, when a voltage is applied across the plurality of electrode pads 121 and the plurality of electrode pads 122 through the plurality of lead pins 25 and the plurality of wires 26, for example, an electrostatic force is generated between the comb electrode 161 and the comb electrode 162 facing each other so that the movable mirror 11 is moved to one side in the Z-axis direction. At this time, the torsion bars 143, 144, 145, 153, 154, and 155 are twisted in the first elastic support portion 14 and the second elastic support portion 15 so that an elastic force is generated in the first elastic support portion 14 and the second elastic support portion 15. In the optical device 10, when a periodic electrical signal is applied to the drive unit 13 through the plurality of lead pins 25 and the plurality of wires 26, the movable mirror 11 can be reciprocated along the Z-axis direction at the resonance frequency level. In this way, the drive unit 13 functions as an electrostatic actuator.

[Operation and Effect]

In the optical module 1A, the movable mirror 11 includes the mirror surface 11a following a plane parallel to the main surface 12a of the base 12. Accordingly, the mirror surface 11a of the movable mirror 11 can be enlarged. Further, in the mirror unit 2, the movable mirror 11 and the drive unit 13 are disposed in the airtight space S. Accordingly, since the drive unit 13 moving the movable mirror 11 is hardly influenced by the external environment, deterioration in the movable performance of the movable mirror 11 can be suppressed. Moreover, the mirror surface 11a of the movable mirror 11 and the mirror surface 21a of the fixed mirror 21 face one side in the Z-axis direction perpendicular to the main surface 12a. Accordingly, the height of the mirror unit 2 in the Z-axis direction can be suppressed as compared with, for example, a positional relationship in which the mirror surface 11a of the movable mirror 11 and the mirror surface 21a of the fixed mirror 21 are orthogonal to each other. Moreover, a part of the optical path P2 between the beam splitter unit 3 and the fixed mirror 21 is disposed in the airtight space S in addition to a part of the optical path P1 between the beam splitter unit 3 and the movable mirror 11. Accordingly, it is possible to suppress the width of the mirror unit 2 in a direction (in the optical module 1A, the X-axis direction) perpendicular to the Z-axis direction. As described above, according to the optical module 1A, it is possible to suppress deterioration in the movable performance of the movable mirror 11 and an increase in the size of the entire module while enlarging the mirror surface 11a of the movable mirror 11.

In the optical module 1A, the support body 22 which supports the base 12 of the optical device 10 and in which the fixed mirror 21 is disposed on the surface 22c corrects the optical path difference between the optical path P1 between the beam splitter unit 3 and the movable mirror 11 and the optical path P2 between the beam splitter unit 3 and the fixed mirror 21. Accordingly, the interference light (that is, the measurement light L1) of the measurement light L0 can be easily and highly accurately obtained. Moreover, a light transmitting member correcting the optical path difference does not need to be provided separately.

In the optical module 1A, the package 24 includes the ceiling wall 243 having optical transparency, the beam splitter unit 3 is supported by the ceiling wall 243 of the package 24, and the airtight space S is formed by the package 24. Accordingly, both of the formation of the airtight space S and the support of the beam splitter unit 3 can be realized by the simple package 24 including the ceiling wall 243 having optical transparency.

In the optical module 1A, the base 12, the main body 111 of the movable mirror 11, the wall portion 112, the plurality of brackets 113 and 114, and the drive unit 13 are configured by the SOI substrate 50. Accordingly, a configuration for reliably moving the movable mirror 11 can be appropriately realized by the SOI substrate 50.

In the optical device 10, the first elastic support portion 14 includes the pair of first levers 141 extending along the main surface 12a from the movable mirror 11 toward both sides of the first optical function portion 17 and the length of each first lever 141 in the X-axis direction where the movable mirror 11 and the first optical function portion 17 are arranged is larger than the shortest distance between the outer edge of the mirror surface 11a and the edge of the first optical function portion 17. Accordingly, since an increase in the distance between the movable mirror 11 and the first optical function portion 17 is suppressed, it is possible to suppress an increase in the size of the entire device. Further, since the length of each first lever 141 of the first elastic support portion 14 is secured, it is possible to suppress deterioration in the movable performance of the movable mirror 11. As described above, according to the optical device 10, it is possible to suppress deterioration in the movable performance of the movable mirror 11 and an increase in the size of the entire device while enlarging the mirror surface 11a of the movable mirror 11.

In the optical device 10, the maximum distance between the pair of first levers 141 in the Y-axis direction is the same as the maximum width of the first optical function portion 17 in the Y-axis direction. Accordingly, it is possible to realize the suppressing of an increase in the distance between the movable mirror 11 and the first optical function portion 17 and the securing of the length of each first lever 141 with higher balance.

In the optical device 10, the distance from a portion closest to the mirror surface 11a in the edge of the first optical function portion 17 to the end portion 141b at the side opposite to the movable mirror 11 in each first lever 141 is larger than the distance from a portion farthest from the mirror surface 11a in the edge of the first optical function portion 17 to the end portion 141b at the side opposite to the movable mirror 11 in each first lever 141. Accordingly, it is possible to realize the suppressing of an increase in the distance between the movable mirror 11 and the first optical function portion 17 and the securing of the length of each first lever 141 with higher balance.

In the optical device 10, the first elastic support portion 14 further includes the pair of second levers 142 extending along the main surface 12a from both sides of the first optical function portion 17 in the Y-axis direction toward the movable mirror 11 and the connection of the pair of first levers 141, the pair of second levers 142, and the base 12 is realized through the plurality of torsion bars 143, 144, and 145. Similarly, the second elastic support portion 15 includes the pair of fourth levers 152 in addition to the pair of third levers 151 and the connection of the pair of third levers 151, the pair of fourth levers 152, and the base 12 is realized through the plurality of torsion bars 153, 154, and 155. Accordingly, it is possible to increase the movable range of the movable mirror 11 and to improve the movable efficiency of the movable mirror 11 (to reduce the driving force necessary for driving the movable mirror 11).

In the optical device 10, the end portion 141a at the side of the movable mirror 11 in each first lever 141 is connected to the movable mirror 11 through the plurality of torsion bars 143 disposed on the same axis parallel to the Y-axis direction. Similarly, the end portion 151a at the side of the movable mirror 11 in each third lever 151 is connected to the movable mirror 11 through the plurality of torsion bars 153 disposed on the same axis parallel to the Y-axis direction. Accordingly, it is possible to shorten the length of each torsion bar 143 disposed on the same axis. Similarly, it is possible to shorten the length of each torsion bar 153 disposed on the same axis. As a result, it is possible to suppress the movement of the movable mirror 11 in the X-axis direction and the rotation of the movable mirror 11 around the axis parallel to the Z-axis direction.

In the first elastic support portion 14 of the optical device 10, the link 146 is laid between the end portions 141a at the side of the movable mirror 11 in the first levers 141 and the link 147 is laid between the end portions 142a at the side opposite to the movable mirror 11 in the second levers 142. Similarly, in the second elastic support portion 15, the link 156 is laid between the end portions 151a at the side of the movable mirror 11 in the third levers 151 and the link 157 is laid between the end portions 152a at the side opposite to the movable mirror 11 in the fourth levers 152. Accordingly, the stability of movement of the movable mirror 11 can be improved. Further, each of the links 146 and 147 extends along the edge of the first optical function portion 17 when viewed from the Z-axis direction. Accordingly, an increase in the size of the entire device can be suppressed.

In the optical device 10, the actuator 16 includes the comb electrodes 161 and 162 disposed along the outer edge of the movable mirror 11. Accordingly, the electrostatic force generated by the comb electrodes 161 and 162 can be efficiently used as the driving force of the movable mirror 11.

In the optical device 10, the main body 111 of the movable mirror 11 is provided with the wall portion 112 surrounding the mirror surface 11a when viewed from the Z-axis direction. Accordingly, since the wall portion 112 functions as a rib, it is possible to suppress the deformation (warping, bending, or the like) of the mirror surface 11a while thinning the main body 111.

[Modified Example of First Embodiment]

Figure 4:
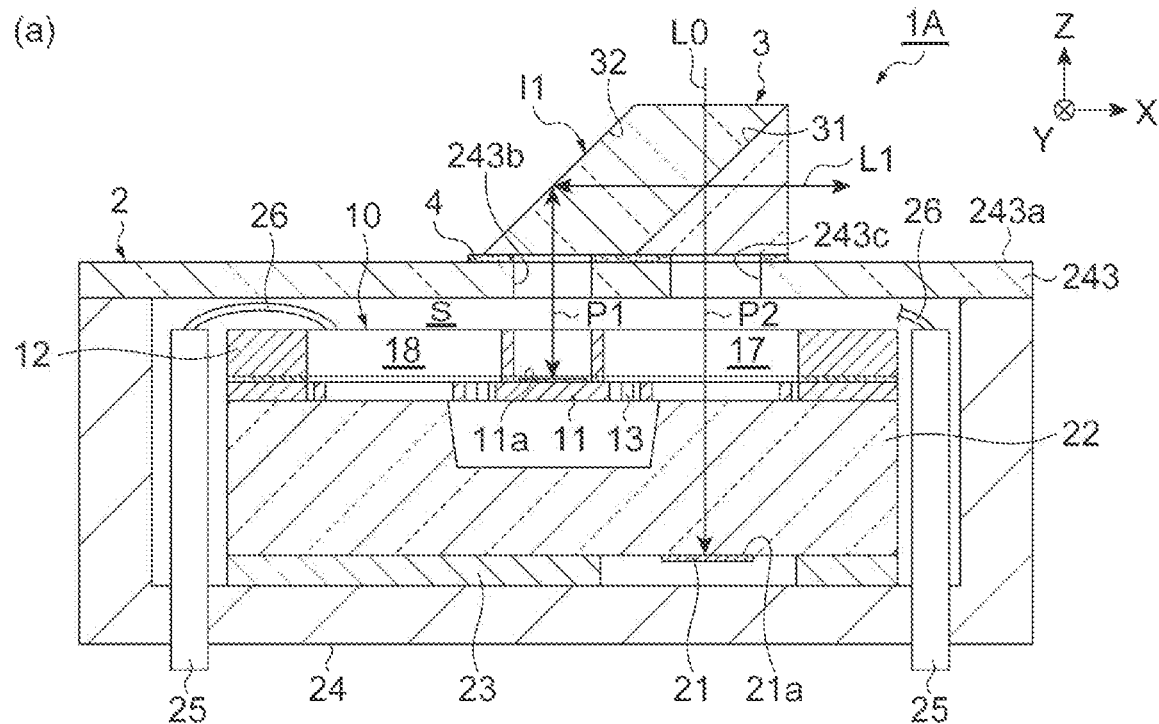
FIG. 4 is a longitudinal sectional view of a modified example of the optical module illustrated in FIG. 1.
Figure 4:
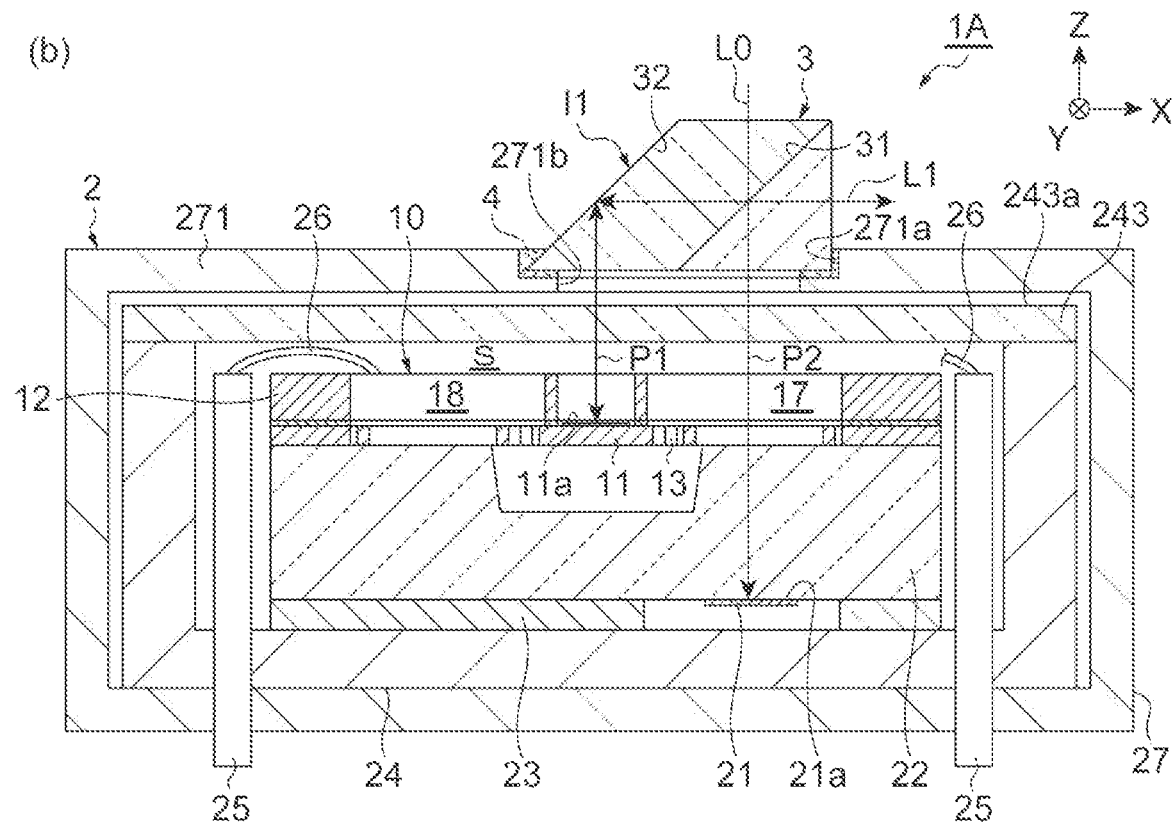

As illustrated in (a) of FIG. 4, the airtight space S may be formed by the package 24 and the beam splitter unit 3. In the optical module 1A illustrated in (a) of FIG. 4, the ceiling wall 243 of the package 24 is provided with an opening 243b through which the optical path P1 passes and an opening 243c through which the optical path P2 passes. Each of the openings 243b and 243c penetrates the ceiling wall 243 in the Z-axis direction. The beam splitter unit 3 is supported by the ceiling wall 243 while blocking each of the openings 243b and 243c. Specifically, the beam splitter unit 3 is fixed to the surface 243a of the ceiling wall 243 by the optical resin 4. According to such a configuration, both of the formation of the airtight space S and the support of the beam splitter unit 3 can be realized by the simple package 24 including the ceiling wall 243 provided with the opening 243b through which the optical path P1 passes and the opening 243c through which the optical path P2 passes. Furthermore, in the optical module 1A illustrated in (a) of FIG. 4, the ceiling wall 243 may not have optical transparency with respect to the measurement light L0. Further, when the optical resin 4 does not enter each of the openings 243b and 243c, a resin that does not have optical transparency with respect to the measurement light L0 may be used instead of the optical resin 4. Further, the ceiling wall 243 of the package 24 may be provided with one opening through which the plurality of optical paths P1 and P2 pass.

Further, as illustrated in (b) of FIG. 4, the support structure 27 supporting the beam splitter unit 3 may be provided separately from the package 24 forming the airtight space S. In the optical module 1A illustrated in (b) of FIG. 4, the beam splitter unit 3 is supported by the support structure 27 while being separated from the ceiling wall 243. Specifically, the beam splitter unit 3 is fixed to an inner surface of a concave portion 271a by the optical resin 4 while a part of the beam splitter unit 3 is disposed in the concave portion 271a formed in the wall portion 271 of the support structure 27. The wall portion 271 faces the ceiling wall 243 in the Z-axis direction and the concave portion 271a is opened to the side opposite to the ceiling wall 243 in the Z-axis direction. The bottom surface of the concave portion 271a is provided with one opening 271b through which the plurality of optical paths P1 and P2 pass. According to such a configuration, since the support structure 27 supporting the beam splitter unit 3 is provided separately from the package 24, the degree of freedom of the layout of the beam splitter unit 3 can be improved. Furthermore, when the optical resin 4 does not enter the opening 271b, a resin that does not have optical transparency with respect to the measurement light L0 may be used instead of the optical resin 4.

Second Embodiment

[Configuration of Optical Module]

Figure 5:
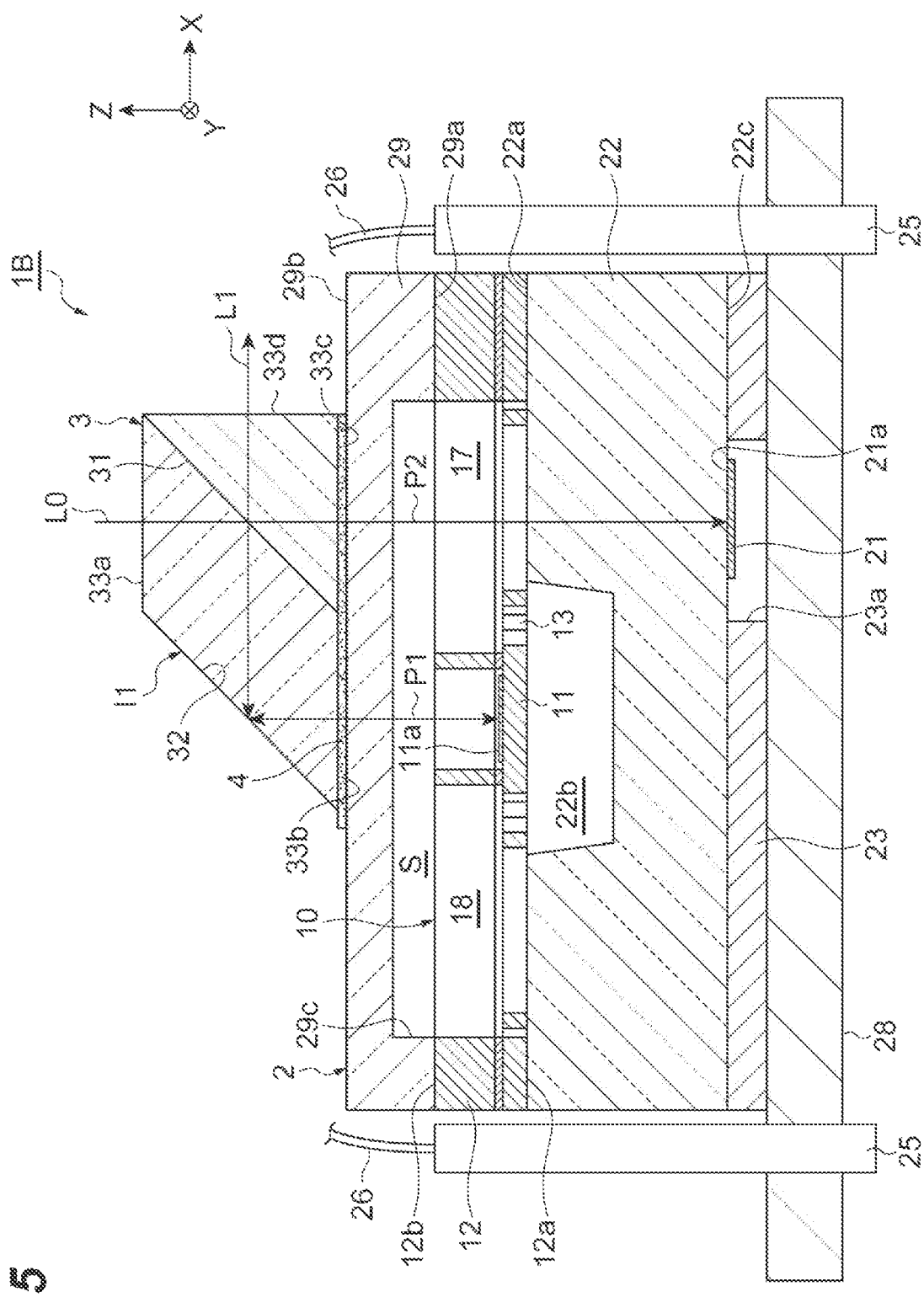
FIG. 5 is a longitudinal sectional view of an optical module of a second embodiment.

As illustrated in FIG. 5, an optical module 1B is different from the optical module 1A illustrated in FIG. 1 in that the airtight space S is formed by the base 12, the support body 22, and a support wall (wall) 29. In the optical module 1B, the sub-mount 23 is fixed onto a substrate 28 and the plurality of lead pins 25 are fixed to the substrate 28 while penetrating the substrate 28.

The support wall 29 is fixed to the main surface 12b of the base 12. The support wall 29 is formed in, for example, a rectangular plate shape. The support wall 29 has optical transparency with respect to the measurement light L0. A concave portion 29c is formed in a surface 29a at the side of the base 12 in the support wall 29. Accordingly, the contact of the movable mirror 11 and the drive unit 13 with respect to the support wall 29 when the movable mirror 11 is moved along the Z-axis direction is prevented. The beam splitter unit 3 is supported by the support wall 29. Specifically, the beam splitter unit 3 is fixed to a surface 29b at the side opposite to the optical device 10 in the support wall 29 by the optical resin 4. The optical resin 4 has optical transparency with respect to the measurement light L0.

[Operation and Effect]

According to the optical module 1B, for the same reason as the above-described optical module 1A, it is possible to suppress deterioration in the movable performance of the movable mirror 11 and an increase in the size of the entire module while enlarging the mirror surface 11a of the movable mirror 11.

In the optical module 1B, the airtight space S is formed by the base 12, the support body 22, and the support wall 29. Accordingly, since the base 12 and the support body 22 function as a part of the package 24 forming the airtight space S, it is possible to suppress an increase in the size of the entire module as compared with, for example, a case in which the package accommodating the base 12 and the support body 22 is provided separately.

[Modified Example of Second Embodiment]

Figure 6:
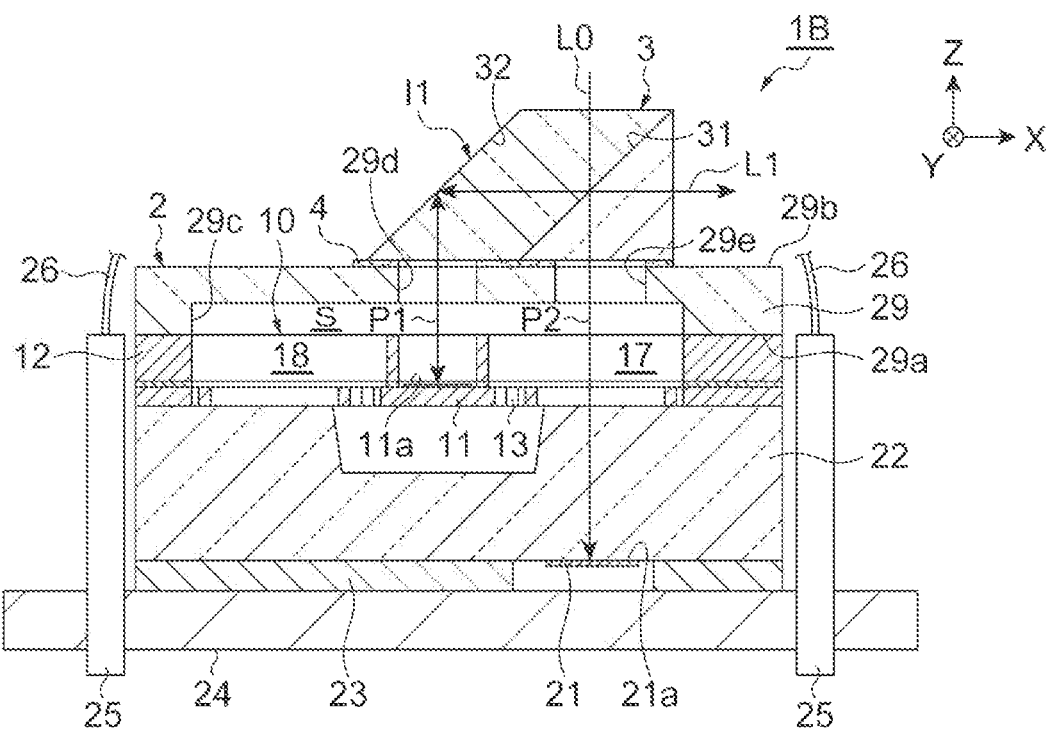
FIG. 6 is a longitudinal sectional view of a modified example of the optical module illustrated in FIG. 5.
Figure 6:
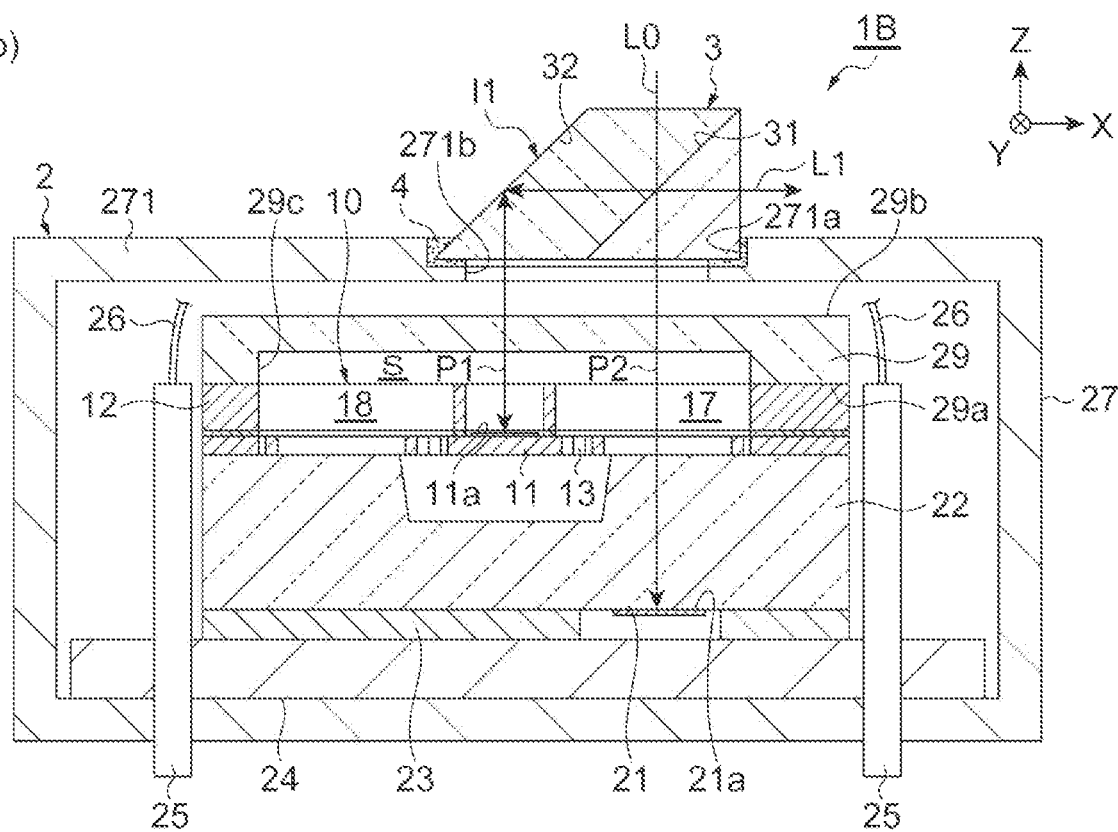

As illustrated in (a) of FIG. 6, the airtight space S may be formed by the base 12, the support body 22, the support wall 29, and the beam splitter unit 3. In the optical module 1B illustrated in (a) of FIG. 6, the support wall 29 is provided with an opening 29d through which the optical path P1 passes and an opening 29e through which the optical path P2 passes. Each of the openings 29d and 29e penetrates the support wall 29 in the Z-axis direction. The beam splitter unit 3 is supported by the support wall 29 while blocking each of the openings 29d and 29e. Specifically, the beam splitter unit 3 is fixed to the surface 29b of the support wall 29 by the optical resin 4. According to such a configuration, since the base 12 and the support body 22 function as a part of the package forming the airtight space S, it is possible to suppress an increase in the size of the entire module as compared with, for example, a case in which the package accommodating the base 12 and the support body 22 is provided separately. Furthermore, in the optical module 1B illustrated in (a) of FIG. 6, the support wall 29 may not have optical transparency with respect to the measurement light L0. Further, when the optical resin 4 does not enter each of the openings 29d and 29e, a resin that does not have optical transparency with respect to the measurement light L0 may be used instead of the optical resin 4. Further, the support wall 29 may be provided with one opening through which the plurality of optical paths P1 and P2 pass.

Further, as illustrated in (b) of FIG. 6, the support structure 27 supporting the beam splitter unit 3 may be provided separately from the support wall 29. In the optical module 1B illustrated in (b) of FIG. 6, the beam splitter unit 3 is supported by the support structure 27 while being separated from the support wall 29. Specifically, the beam splitter unit 3 is fixed to the inner surface of the concave portion 271a by the optical resin 4 while a part of the beam splitter unit 3 is disposed in the concave portion 271a formed in the wall portion 271 of the support structure 27. The wall portion 271 faces the support wall 29 in the Z-axis direction and the concave portion 271a is opened to the side opposite to the support wall 29 in the Z-axis direction. The bottom surface of the concave portion 271a is provided with one opening 271b through which the plurality of optical paths P1 and P2 pass. According to such a configuration, since the base 12 and the support body 22 function as a part of the package forming the airtight space S, it is possible to suppress an increase in the size of the entire module as compared with, for example, a case in which the package accommodating the base 12 and the support body 22 is provided separately. Further, since the mirror unit 2 includes the support structure 27 supporting the beam splitter unit 3 separately from the support wall 29, the degree of freedom of the layout of the beam splitter unit 3 can be improved. Furthermore, when the optical resin 4 does not enter the opening 271b, a resin that does not have optical transparency with respect to the measurement light L0 may be used instead of the optical resin 4.

Third Embodiment

[Configuration of Optical Module]

Figure 7:
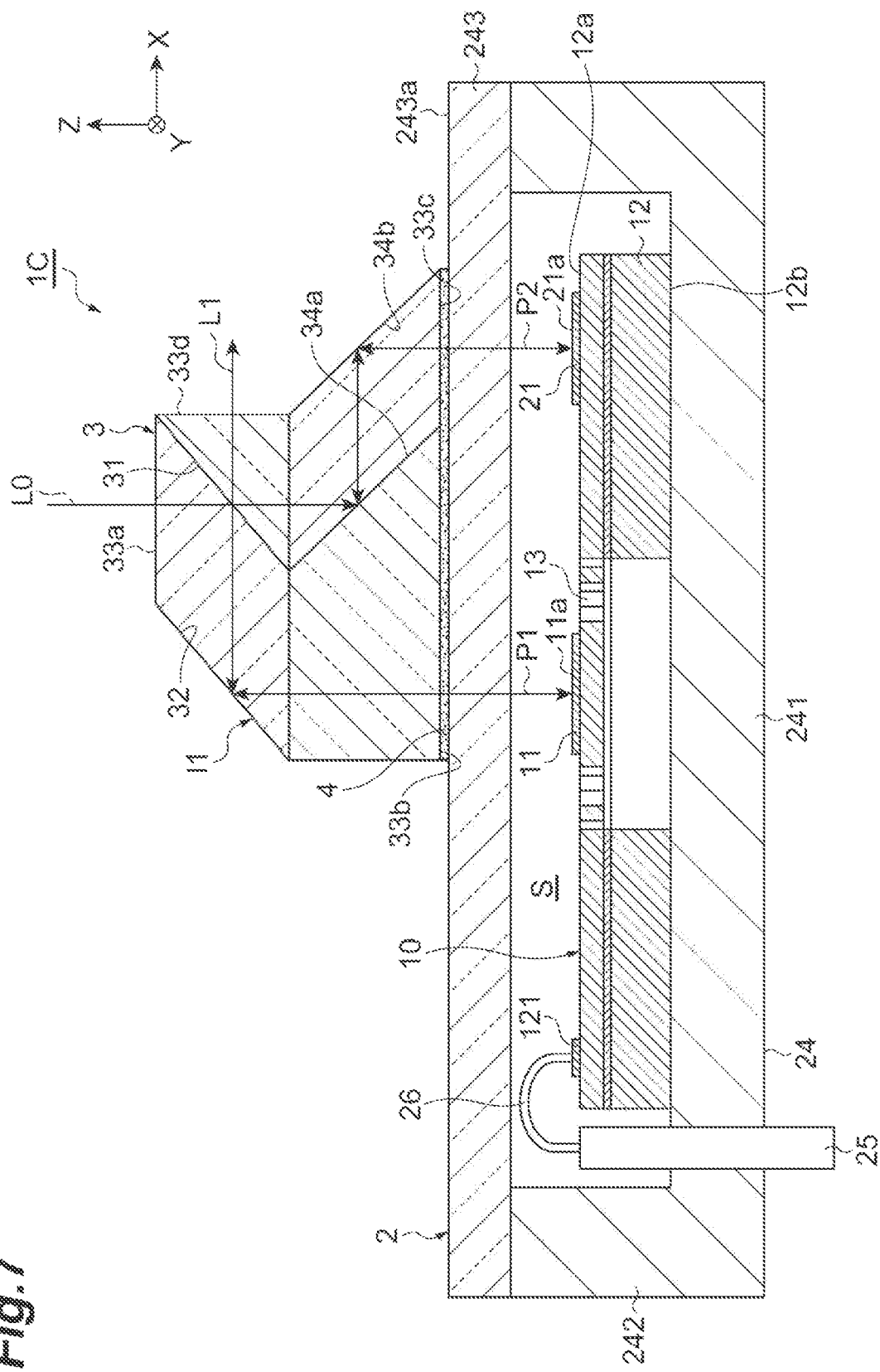
FIG. 7 is a longitudinal sectional view of an optical module of a third embodiment.

As illustrated in FIG. 7, an optical module 1C is mainly different from the optical module 1A illustrated in FIG. 1 in that the mirror surface 11a of the movable mirror 11 and the mirror surface 21a of the fixed mirror 21 are disposed along the same plane parallel to the main surface 12a of the base 12 and the beam splitter unit 3 corrects the optical path difference between the optical path P1 and the optical path P2. In the optical module 1C, the base 12 of the optical device 10 is fixed to the inner surface of the bottom wall 241 of the package 24. In the optical module 1C, the optical device 10 is disposed so that the main surface 12a of the base 12 faces the inner surface of the ceiling wall 243 and the main surface 12b of the base 12 faces the inner surface of the bottom wall 241.

A metal film forming the movable mirror 11 is formed on a plane of the movable mirror 11 including the main surface 12a of the base 12. A metal film forming the fixed mirror 21 is formed on the main surface 12a of the base 12. In this case, the fixed mirror 21 functions as the first optical function portion 17.

The beam splitter unit 3 includes a plurality of total reflection mirror surfaces 34a and 34b in addition to the half mirror surface 31, the total reflection mirror surface 32, and the plurality of optical surfaces 33a, 33b, 33c, and 33d. The beam splitter unit 3 is configured by bonding a plurality of optical blocks. Each of the total reflection mirror surfaces 34a and 34b is formed by, for example, a metal film. The total reflection mirror surface 34a is, for example, a surface inclined by 45° toward the side opposite to the half mirror surface 31 with respect to the optical surface 33a and overlaps the half mirror surface 31 when viewed from the Z-axis direction. The total reflection mirror surface 34a reflects the remaining part of the measurement light L0 transmitted through the half mirror surface 31 along the X-axis direction. The total reflection mirror surface 34b is a surface parallel to the total reflection mirror surface 34a, overlaps the mirror surface 21a of the fixed mirror 21 when viewed from the Z-axis direction, and overlaps the total reflection mirror surface 34a when viewed from the X-axis direction. The total reflection mirror surface 34b reflects the remaining part of the measurement light L0 reflected by the total reflection mirror surface 34a toward the fixed mirror 21 along the Z-axis direction.

In the optical module 1C with the above-described configuration, when the measurement light L0 is incident from the outside of the optical module 1C to the beam splitter unit 3 through the optical surface 33a, a part of the measurement light L0 is sequentially reflected by the half mirror surface 31 and the total reflection mirror surface 32 and travels toward the mirror surface 11a of the movable mirror 11. Then, a part of the measurement light L0 is reflected by the mirror surface 11a of the movable mirror 11, travels in the reverse direction on the same optical path (the optical path P1), and is transmitted through the half mirror surface 31 of the beam splitter unit 3.

Meanwhile, the remaining part of the measurement light L0 is transmitted through the half mirror surface 31 of the beam splitter unit 3, is sequentially reflected by the plurality of total reflection mirror surfaces 34a and 34b, and travels toward the mirror surface 21a of the fixed mirror 21. Then, the remaining part of the measurement light L0 is reflected by the mirror surface 21a of the fixed mirror 21, travels in the reverse direction on the same optical path (the optical path P2), and is reflected by the half mirror surface 31 of the beam splitter unit 3.

A part of the measurement light L0 transmitted through the half mirror surface 31 of the beam splitter unit 3 and the remaining part of the measurement light L0 reflected by the half mirror surface 31 of the beam splitter unit 3 become the measurement light L1 that is the interference light and the measurement light L1 is emitted from the beam splitter unit 3 to the outside of the optical module 1C through the optical surface 33d. In the optical module 1C, the beam splitter unit 3 corrects the optical path difference between the optical path P1 between the beam splitter unit 3 and the movable mirror 11 and the optical path P2 between the beam splitter unit 3 and the fixed mirror 21.

[Operation and Effect]

According to the optical module 1C, for the same reason as the above-described optical module 1A, it is possible to suppress deterioration in the movable performance of the movable mirror 11 and an increase in the size of the entire module while enlarging the mirror surface 11a of the movable mirror 11.

In the optical module 1C, the mirror surface 11a of the movable mirror 11 and the mirror surface 21a of the fixed mirror 21 are disposed along the same plane parallel to the main surface 12a of the base 12 and the beam splitter unit 3 corrects the optical path difference between the optical path P1 and the optical path P2. Accordingly, the height of the mirror unit 2 in the Z-axis direction can be suppressed as compared with, for example, a case in which a light transmitting member for correcting the optical path difference is provided separately.

In the optical module 1C, the beam splitter unit 3 is supported by the ceiling wall 243 of the package 24 and the airtight space S is formed by the package 24. Accordingly, both of the formation of the airtight space S and the support of the beam splitter unit 3 can be realized by the simple package 24 including the ceiling wall 243 having optical transparency.

[Modified Example of Third Embodiment]

Figure 8:
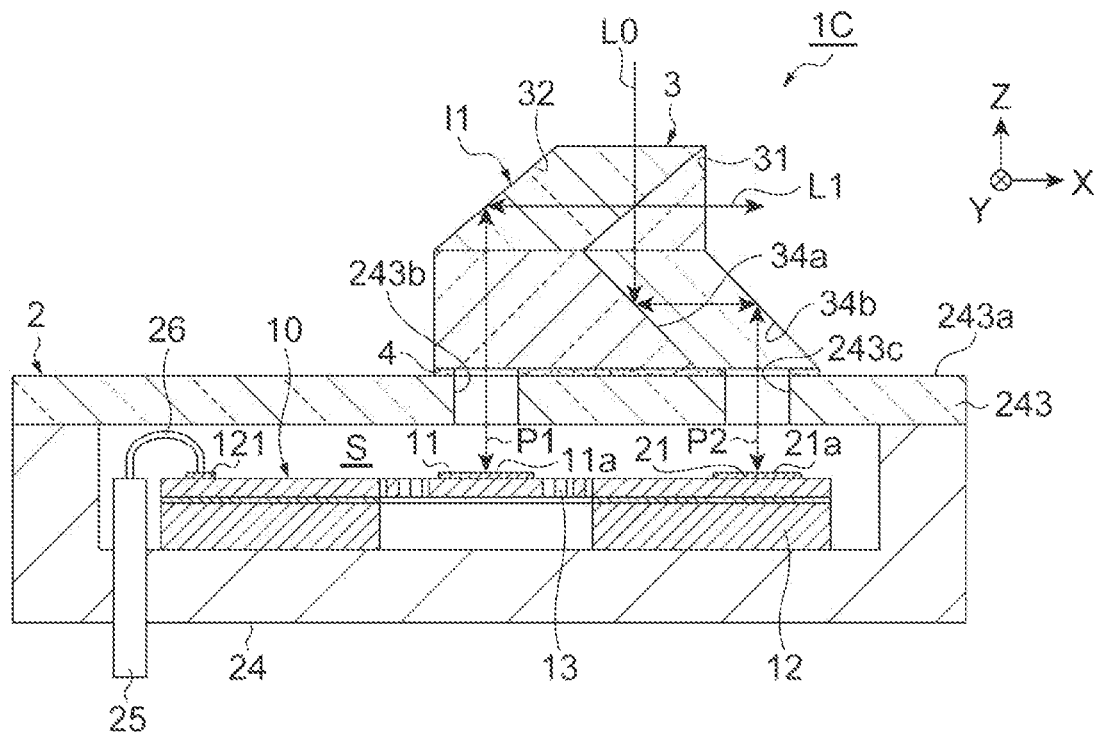
FIG. 8 is a longitudinal sectional view of a modified example of the optical module illustrated in FIG. 7.
Figure 8:
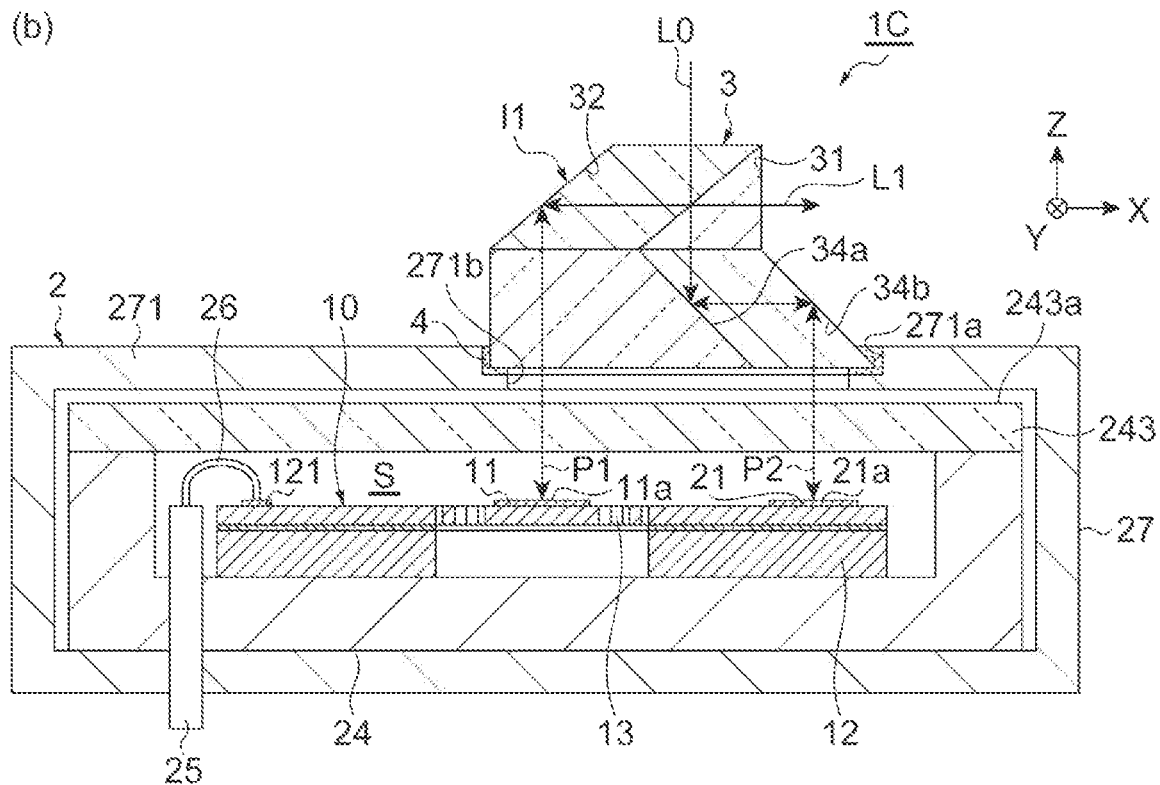

As illustrated in (a) of FIG. 8, the airtight space S may be formed by the package 24 and the beam splitter unit 3. In the optical module 1C illustrated in (a) of FIG. 8, the ceiling wall 243 of the package 24 is provided with an opening 243b through which the optical path P1 passes and an opening 243c through which the optical path P2 passes. Each of the openings 243b and 243c penetrates the ceiling wall 243 in the Z-axis direction. The beam splitter unit 3 is supported by the ceiling wall 243 while blocking each of the openings 243b and 243c. Specifically, the beam splitter unit 3 is fixed to the surface 243a of the ceiling wall 243 by the optical resin 4. According to such a configuration, both of the formation of the airtight space S and the support of the beam splitter unit 3 can be realized by the simple package 24 including the ceiling wall 243 provided with the opening 243b through which the optical path P1 passes and the opening 243c through which the optical path P2 passes. Furthermore, in the optical module 1C illustrated in (a) of FIG. 8, the ceiling wall 243 may not have optical transparency with respect to the measurement light L0. Further, when the optical resin 4 does not enter each of the openings 243b and 243c, a resin that does not have optical transparency with respect to the measurement light L0 may be used instead of the optical resin 4. Further, the ceiling wall 243 of the package 24 may be provided with one opening through which the plurality of optical paths P1 and P2 pass.

Further, as illustrated in (b) of FIG. 8, the support structure 27 supporting the beam splitter unit 3 may be provided separately from the package 24 forming the airtight space S. In the optical module 1C illustrated in (b) of FIG. 8, the beam splitter unit 3 is supported by the support structure 27 while being separated from the ceiling wall 243. Specifically, the beam splitter unit 3 is fixed to the inner surface of the concave portion 271a by the optical resin 4 while a part of the beam splitter unit 3 is disposed in the concave portion 271a formed in the wall portion 271 of the support structure 27. The wall portion 271 faces the ceiling wall 243 in the Z-axis direction and the concave portion 271a is opened to the side opposite to the ceiling wall 243 in the Z-axis direction. The bottom surface of the concave portion 271a is provided with one opening 271b through which the plurality of optical paths P1 and P2 pass. According to such a configuration, since the support structure 27 supporting the beam splitter unit 3 is provided separately from the package 24, the degree of freedom of the layout of the beam splitter unit 3 can be improved. Furthermore, when the optical resin 4 does not enter the opening 271b, a resin that does not have optical transparency with respect to the measurement light L0 may be used instead of the optical resin 4.

Fourth Embodiment

[Configuration of Optical Module]

Figure 9:
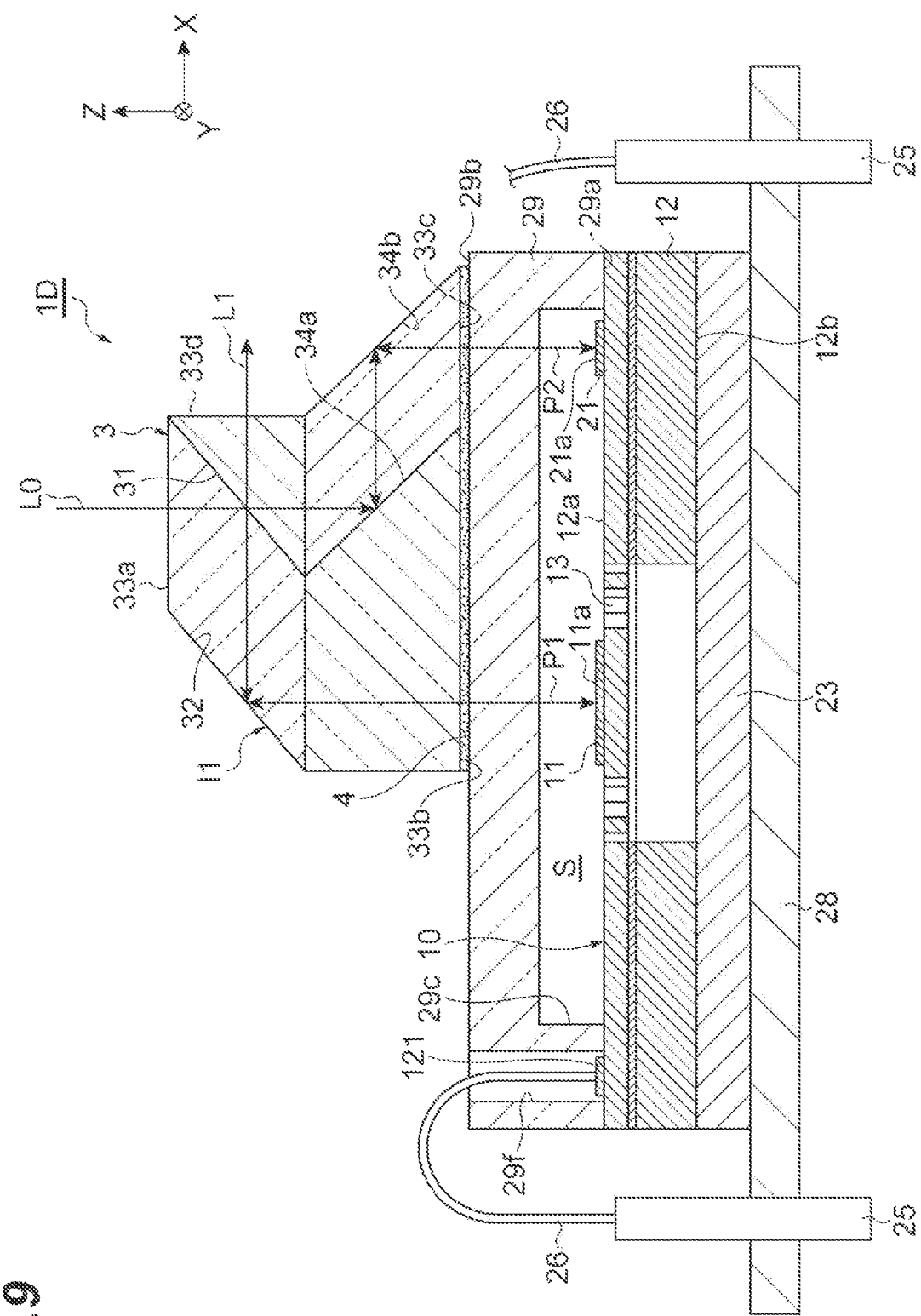
FIG. 9 is a longitudinal sectional view of an optical module of a fourth embodiment.

As illustrated in FIG. 9, an optical module 1D is mainly different from the optical module 1C illustrated in FIG. 7 in that the airtight space S is formed by the base 12, the sub-mount 23, and the support wall (wall) 29. In the optical module 1D, the sub-mount 23 is fixed onto the substrate 28 and the plurality of lead pins 25 is fixed to the substrate 28 while penetrating the substrate 28.

The support wall 29 is fixed to the main surface 12a of the base 12. The support wall 29 is formed in, for example, a rectangular plate shape. The support wall 29 has optical transparency with respect to the measurement light L0. The concave portion 29c is formed in the surface 29a at the side of the base 12 in the support wall 29. Accordingly, the contact of the movable mirror 11 and the drive unit 13 with respect to the support wall 29 when the movable mirror 11 is moved along the Z-axis direction is prevented. The beam splitter unit 3 is supported by the support wall 29. Specifically, the beam splitter unit 3 is fixed to the surface 29b at the side opposite to the optical device 10 in the support wall 29 by the optical resin 4. The optical resin 4 has optical transparency with respect to the measurement light L0.

[Operation and Effect]

According to the optical module 1D, for the same reason as the above-described optical module 1A, it is possible to suppress deterioration in the movable performance of the movable mirror 11 and an increase in the size of the entire module while enlarging the mirror surface 11a of the movable mirror 11.

In the optical module 1D, the airtight space S is formed by the base 12, the sub-mount 23, and the support wall 29. Accordingly, since the base 12 functions as a part of the package 24 forming the airtight space S, it is possible to suppress an increase in the size of the entire module as compared with, for example, a case in which the package accommodating the base 12 is provided separately.

[Modified Example of Fourth Embodiment]

Figure 10:
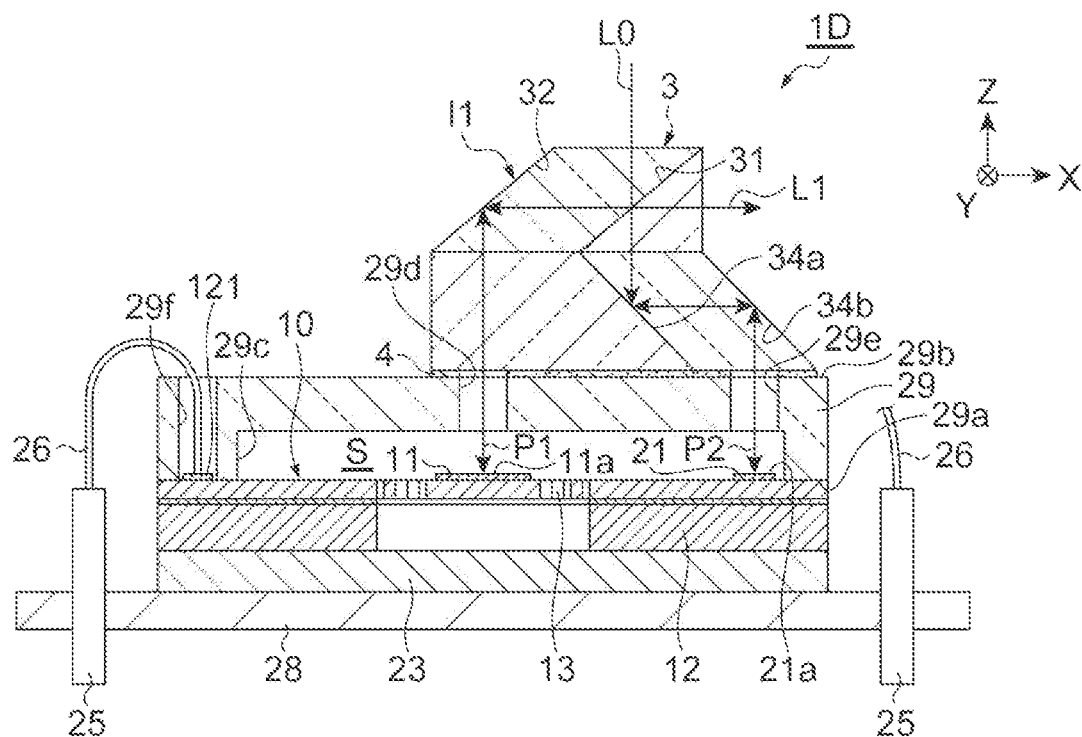
FIG. 10 is a longitudinal sectional view of a modified example of the optical module illustrated in FIG. 9.
Figure 10:
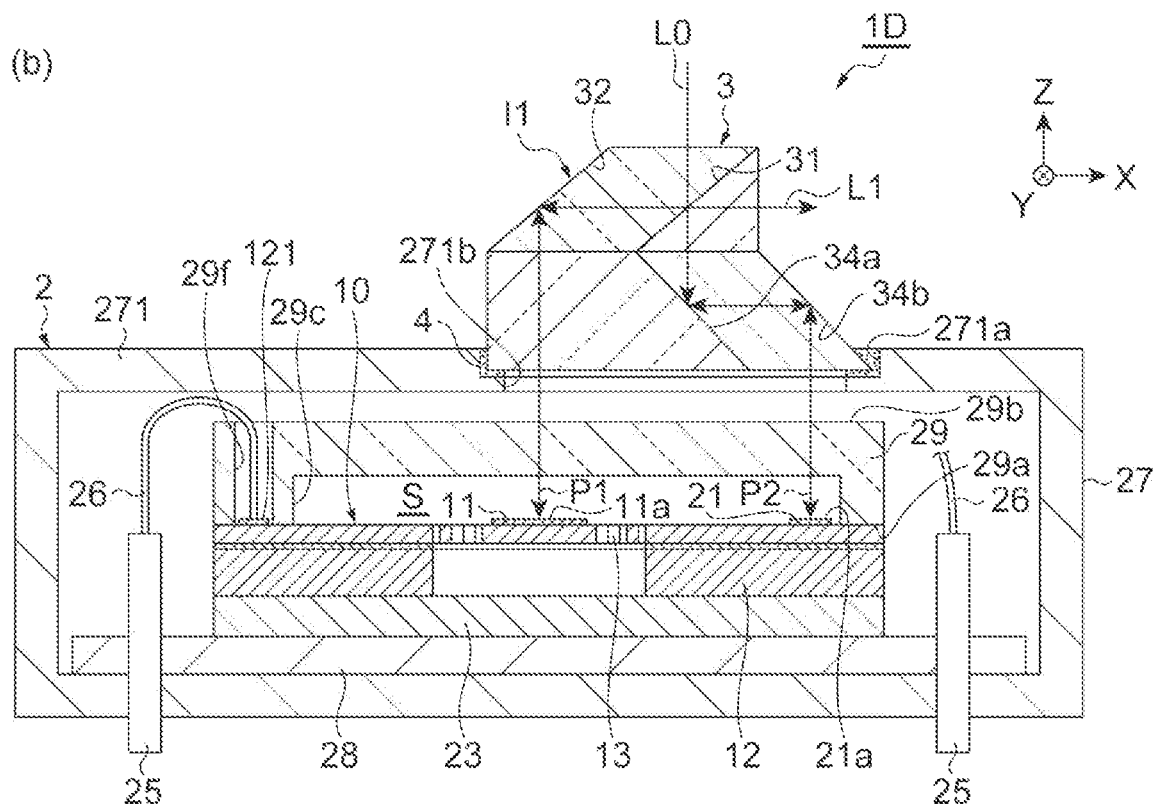

As illustrated in (a) of FIG. 10, the airtight space S may be formed by the base 12, the sub-mount 23, the support wall 29, and the beam splitter unit 3. In the optical module 1D illustrated in (a) of FIG. 10, the support wall 29 is provided with an opening 29d through which the optical path P1 passes and an opening 29e through which the optical path P2 passes. Each of the openings 29d and 29e penetrates the support wall 29 in the Z-axis direction. The beam splitter unit 3 is supported by the support wall 29 while blocking each of the openings 29d and 29e. Specifically, the beam splitter unit 3 is fixed to the surface 29b of the support wall 29 by the optical resin 4. According to such a configuration, since the base 12 functions as a part of the package forming the airtight space S, it is possible to suppress an increase in the size of the entire module as compared with, for example, a case in which the package accommodating the base 12 is provided separately. Furthermore, in the optical module 1D illustrated in (a) of FIG. 10, the support wall 29 may not have optical transparency with respect to the measurement light L0. Further, when the optical resin 4 does not enter each of the openings 29d and 29e, a resin that does not have optical transparency with respect to the measurement light L0 may be used instead of the optical resin 4. Further, the support wall 29 may be provided with one opening through which the plurality of optical paths P1 and P2 pass.

Further, as illustrated in (b) of FIG. 10, the support structure 27 supporting the beam splitter unit 3 may be provided separately from the support wall 29. In the optical module 1D illustrated in (b) of FIG. 10, the beam splitter unit 3 is supported by the support structure 27 while being separated from the support wall 29. Specifically, the beam splitter unit 3 is fixed to the inner surface of the concave portion 271a by the optical resin 4 while a part of the beam splitter unit 3 is disposed in the concave portion 271a formed in the wall portion 271 of the support structure 27. The wall portion 271 faces the support wall 29 in the Z-axis direction and the concave portion 271a is opened to the side opposite to the support wall 29 in the Z-axis direction. The bottom surface of the concave portion 271a is provided with one opening 271b through which the plurality of optical paths P1 and P2 pass. According to such a configuration, since the base 12 functions as a part of the package forming the airtight space S, it is possible to suppress an increase in the size of the entire module as compared with, for example, a case in which the package accommodating the base 12 is provided separately. Further, since the mirror unit 2 includes the support structure 27 supporting the beam splitter unit 3 separately from the support wall 29, the degree of freedom of the layout of the beam splitter unit 3 can be improved. Furthermore, when the optical resin 4 does not enter the opening 271b, a resin that does not have optical transparency with respect to the measurement light L0 may be used instead of the optical resin 4.

Figure 11:
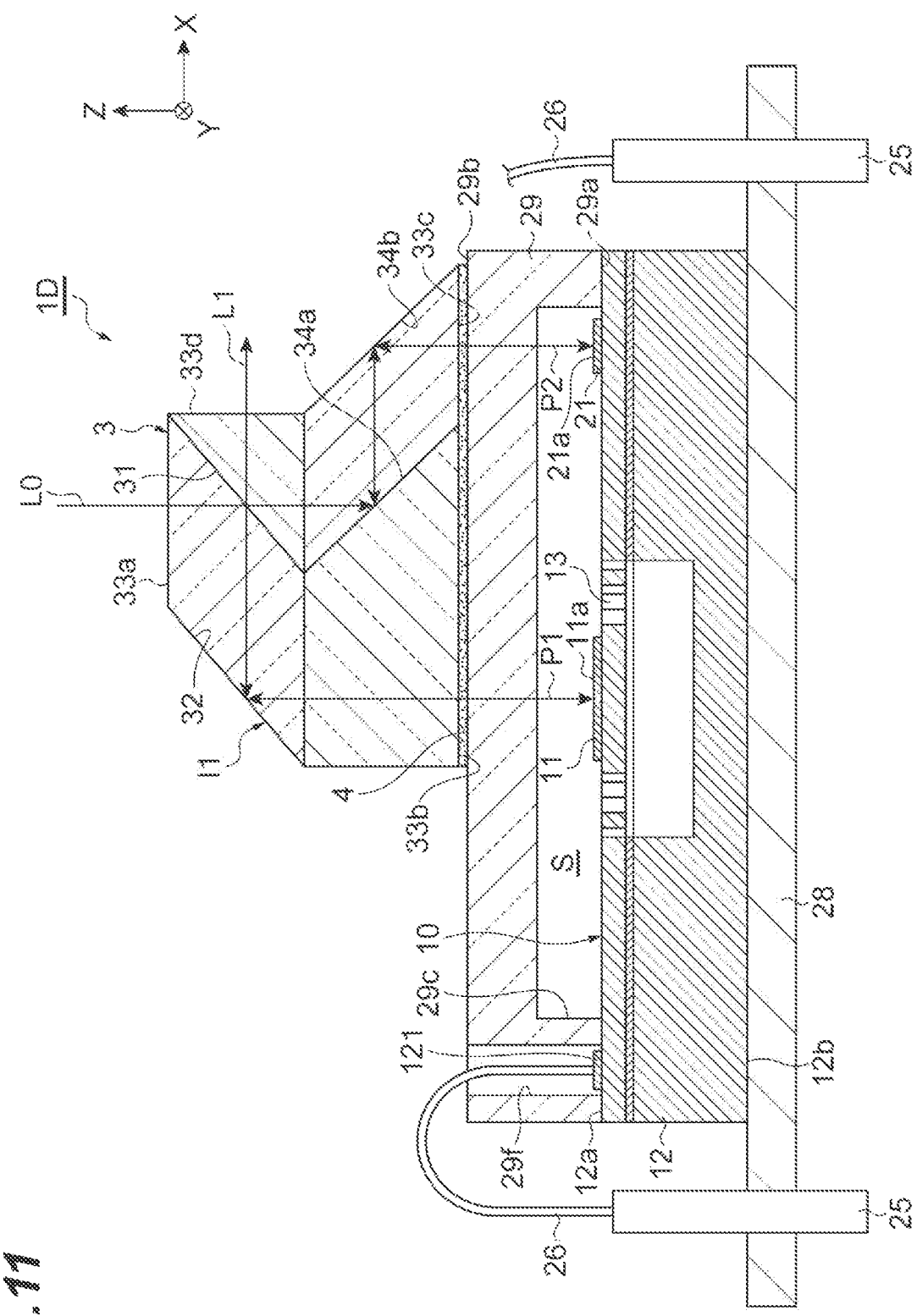
FIG. 11 is a longitudinal sectional view of a modified example of the optical module illustrated in FIG. 9.

Further, as illustrated in FIG. 11, in the optical module 1D, the sub-mount 23 may not be provided. In this case, since a portion corresponding to the sub-mount 23 is integrally formed by the support layer 51 (see FIG. 2) as the base 12, the airtight space S can be easily and reliably formed.

Fifth Embodiment

[Configuration of Optical Module]

Figure 12:
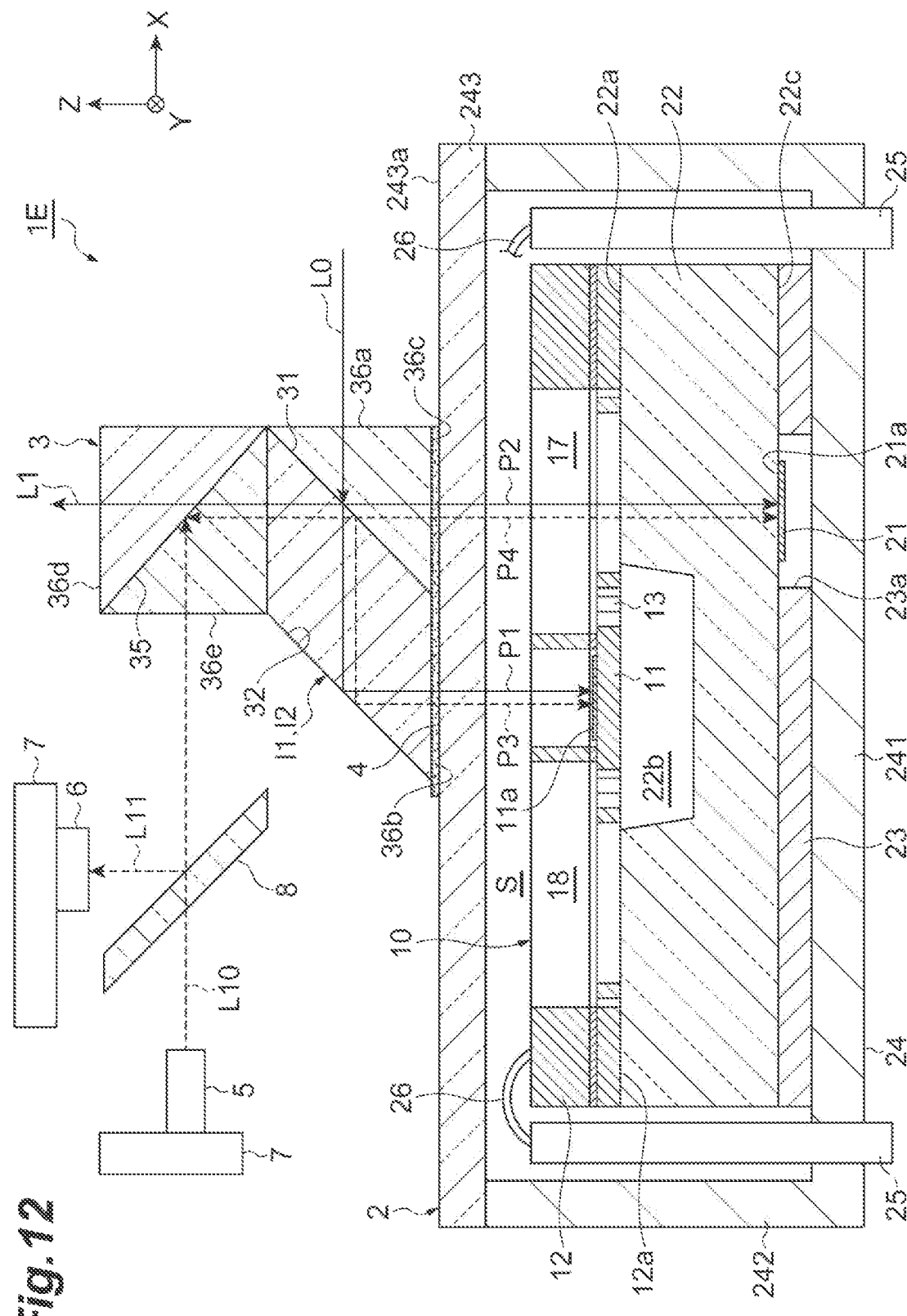
FIG. 12 is a longitudinal sectional view of an optical module of a fifth embodiment.

As illustrated in FIG. 12, an optical module 1E is mainly different from the optical module 1A illustrated in FIG. 1 in that the beam splitter unit 3 constitutes an interference optical system I1 for the measurement light L0 and an interference optical system (a second interference optical system) I2 for the laser light L10 along with the movable mirror 11 and the fixed mirror 21. The optical module 1E includes a light source 5, a photodetector 6, a plurality of circuit boards 7, and a half mirror 8. The light source 5 generates the laser light L10 to be incident to the interference optical system I2. The light source 5 is configured as, for example, a laser diode or the like. The photodetector 6 detects the laser light L11 emitted from the interference optical system I2 (the interference light of the laser light L10). The photodetector 6 is configured as, for example, a photodiode or the like. The light source 5 and the photodetector 6 are mounted on another circuit board 7. The half mirror 8 transmits the laser light L10 emitted from the light source 5 and reflects the laser light L11 emitted from the interference optical system I2.

The beam splitter unit 3 includes the half mirror surface 31, the total reflection mirror surface 32, a dichroic mirror surface 35, and a plurality of optical surfaces 36a, 36b, 36c, and 36d. The beam splitter unit 3 is configured by bonding a plurality of optical blocks. The dichroic mirror surface 35 is formed by, for example, a dielectric multilayer.

The optical surface 36a is, for example, a surface perpendicular to the X-axis direction. The half mirror surface 31 is, for example, a surface inclined by 45° with respect to the optical surface 36a, overlaps the mirror surface 21a of the fixed mirror 21 when viewed from the Z-axis direction, and overlaps the optical surface 36a when viewed from the X-axis direction. The total reflection mirror surface 32 is a surface parallel to the half mirror surface 31, overlaps the mirror surface 11a of the movable mirror 11 when viewed from the Z-axis direction, and overlaps the half mirror surface 31 when viewed from the X-axis direction.

The optical surface 36b is a surface perpendicular to the optical surface 36a and overlaps the mirror surface 11a of the movable mirror 11 when viewed from the Z-axis direction. The optical surface 36b is located between the total reflection mirror surface 32 and the mirror surface 11a of the movable mirror 11 in the Z-axis direction. The optical surface 36c is a surface perpendicular to the optical surface 36a and overlaps the mirror surface 21a of the fixed mirror 21 when viewed from the Z-axis direction. The optical surface 36c is located between the half mirror surface 31 and the mirror surface 21a of the fixed mirror 21 in the Z-axis direction. The optical surface 36d is a surface perpendicular to the optical surface 36a and overlaps the mirror surface 21a of the fixed mirror 21 when viewed from the Z-axis direction. The optical surface 36d is located at the side opposite to the mirror surface 21a of the fixed mirror 21 with respect to the half mirror surface 31 in the Z-axis direction.

An optical surface 36e is, for example, a surface perpendicular to the X-axis direction. The dichroic mirror surface 35 is, for example, a surface inclined by 45° toward the side opposite to the half mirror surface 31 with respect to the optical surface 36e, overlaps the mirror surface 21a of the fixed mirror 21 when viewed from the Z-axis direction, and overlaps the optical surface 36e when viewed from the X-axis direction. The dichroic mirror surface 35 is located between the optical surface 36d and the half mirror surface 31 in the Z-axis direction.

In the optical module 1E with the above-described configuration, when the measurement light L0 is incident from the outside of the optical module 1E to the beam splitter unit 3 through the optical surface 36a, a part of the measurement light L0 is transmitted through the half mirror surface 31, is reflected by the total reflection mirror surface 32, and travels toward the mirror surface 11a of the movable mirror 11. Then, a part of the measurement light L0 is reflected by the mirror surface 11a of the movable mirror 11, travels in the reverse direction on the same optical path (the optical path P1), and is reflected by the half mirror surface 31.

Meanwhile, the remaining part of the measurement light L0 is reflected by the half mirror surface 31, passes through the first optical function portion 17, is further transmitted through the support body 22, and travels toward the mirror surface 21a of the fixed mirror 21. Then, the remaining part of the measurement light L0 is reflected by the mirror surface 21a of the fixed mirror 21, travels in the reverse direction on the same optical path (the optical path P2), and is transmitted through the half mirror surface 31.

A part of the measurement light L0 reflected by the half mirror surface 31 and the remaining part of the measurement light L0 transmitted through the half mirror surface 31 become the measurement light L1 that is the interference light and the measurement light L1 is transmitted through the dichroic mirror surface 35 and is emitted from the beam splitter unit 3 to the outside of the optical module 1E through the optical surface 36d.

Further, when the laser light L10 emitted from the light source 5 is transmitted through the half mirror 8 and is incident to the beam splitter unit 3 through the optical surface 36e, the laser light L10 is reflected by the dichroic mirror surface 35 and travels toward the half mirror surface 31. A part of the laser light L10 is sequentially reflected by the half mirror surface 31 and the total reflection mirror surface 32 and travels toward the mirror surface 11a of the movable mirror 11. Then, a part of the laser light L10 is reflected by the mirror surface 11a of the movable mirror 11, travels in the reverse direction on the same optical path (an optical path P3), and is reflected by the half mirror surface 31.

Meanwhile, the remaining part of the laser light L10 is transmitted through the half mirror surface 31, passes through the first optical function portion 17, is further transmitted through the support body 22, and travels toward the mirror surface 21a of the fixed mirror 21. Then, the remaining part of the laser light L10 is reflected by the mirror surface 21a of the fixed mirror 21, travels in the reverse direction on the same optical path (an optical path P4), and is transmitted through the half mirror surface 31.

A part of the laser light L10 reflected by the half mirror surface 31 and the remaining part of the laser light L10 transmitted through the half mirror surface 31 become the laser light L11 that is the interference light and the laser light L11 is reflected by the dichroic mirror surface 35 and is emitted from the beam splitter unit 3 through the optical surface 36e. The laser light L11 emitted from the beam splitter unit 3 is reflected by the half mirror 8, is incident to the photodetector 6, and is detected by the photodetector 6.

[Operation and Effect]

According to the optical module 1E, for the same reason as the above-described optical module 1A, it is possible to suppress deterioration in the movable performance of the movable mirror 11 and an increase in the size of the entire module while enlarging the mirror surface 11a of the movable mirror 11.

In the optical module 1E, the beam splitter unit 3 constitutes the interference optical system I2 for the laser light L10 along with the movable mirror 11 and the fixed mirror 21. Accordingly, since the laser light L11 that is the interference light of the laser light L10 is detected, it is possible to highly accurately measure the position of the mirror surface 11a of the movable mirror 11. Further, the beam splitter unit 3 constitutes the interference optical system I1 for the measurement light L0 and the interference optical system I2 for the laser light L10 along with the movable mirror 11 and the fixed mirror 21. For that reason, it is possible to decrease the number of parts of the mirror unit 2.

Modified Example of Fifth Embodiment

Figure 13:
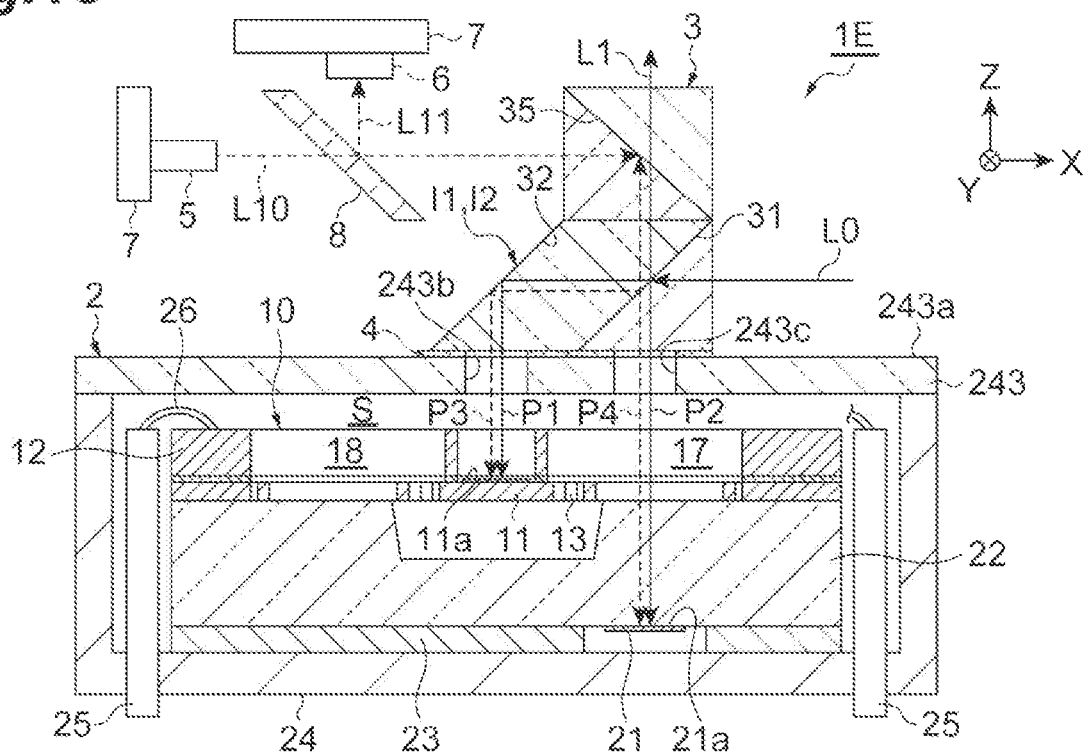
FIG. 13 is a longitudinal sectional view of a modified example of the optical module illustrated in FIG. 12.
Figure 13:
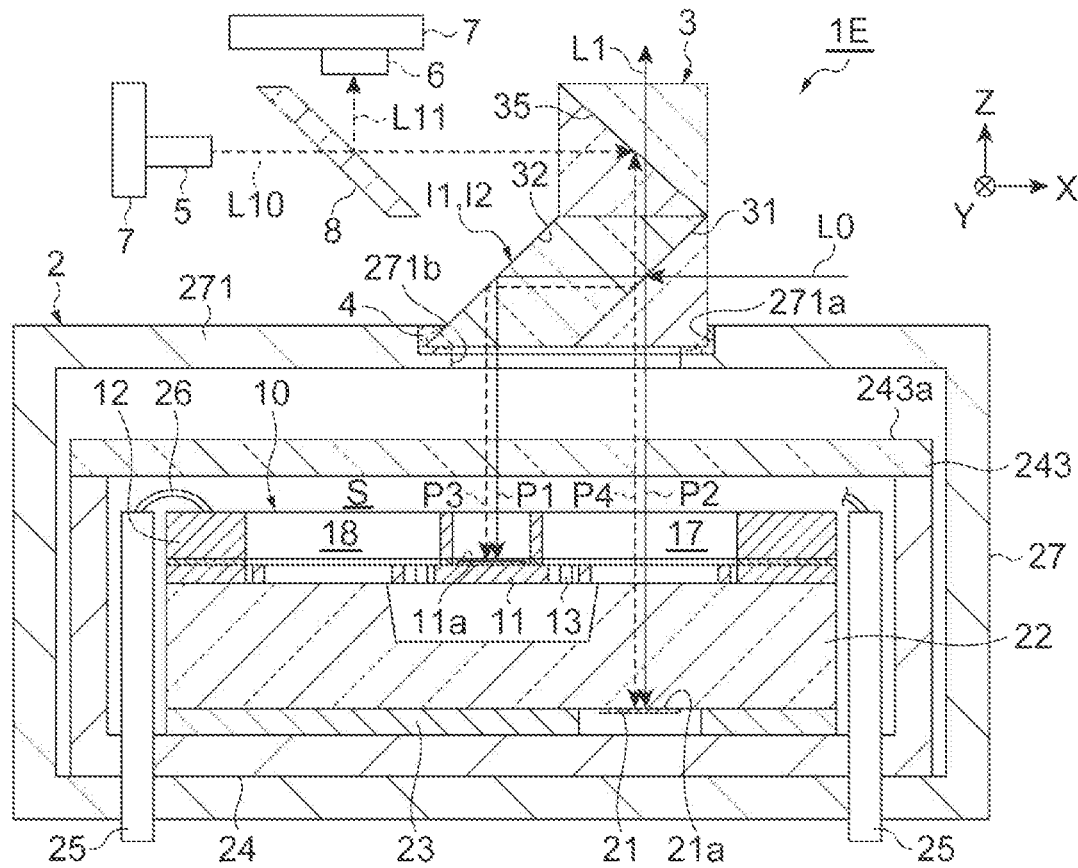

As illustrated in (a) of FIG. 13, the airtight space S may be formed by the package 24 and the beam splitter unit 3. In the optical module 1E illustrated in (a) of FIG. 13, the ceiling wall 243 of the package 24 is provided with an opening 243b through which the optical paths P1 and P3 pass and an opening 243c through which the optical paths P2 and P4 pass. Each of the openings 243b and 243c penetrates the ceiling wall 243 in the Z-axis direction. The beam splitter unit 3 is supported by the ceiling wall 243 while blocking each of the openings 243b and 243c. Specifically, the beam splitter unit 3 is fixed to the surface 243a of the ceiling wall 243 by the optical resin 4. According to such a configuration, both of the formation of the airtight space S and the support of the beam splitter unit 3 can be realized by the simple package 24 including the ceiling wall 243 provided with the opening 243b through which the optical paths P1 and P3 pass and the opening 243c through which the optical paths P2 and P4 pass. Furthermore, in the optical module 1E illustrated in (a) of FIG. 13, the ceiling wall 243 may not have optical transparency with respect to the measurement light L0 and the laser light L10. Further, when the optical resin 4 does not enter each of the openings 243b and 243c, a resin that does not have optical transparency with respect to the measurement light L0 and the laser light L10 may be used instead of the optical resin 4. Further, the ceiling wall 243 of the package 24 may be provided with one opening through which the plurality of optical paths P1, P2, P3, and P4 pass.

Further, as illustrated in (b) of FIG. 13, the support structure 27 supporting the beam splitter unit 3 may be provided separately from the package 24 forming the airtight space S. In the optical module 1E illustrated in (b) of FIG. 13, the beam splitter unit 3 is supported by the support structure 27 while being separated from the ceiling wall 243. Specifically, the beam splitter unit 3 is fixed to the inner surface of the concave portion 271a by the optical resin 4 while a part of the beam splitter unit 3 is disposed in the concave portion 271a formed in the wall portion 271 of the support structure 27. The wall portion 271 faces the ceiling wall 243 in the Z-axis direction and the concave portion 271a is opened to the side opposite to the ceiling wall 243 in the Z-axis direction. The bottom surface of the concave portion 271a is provided with one opening 271b through which the plurality of optical paths P1, P2, P3, and P4 pass. According to such a configuration, since the support structure 27 supporting the beam splitter unit 3 is provided separately from the package 24, the degree of freedom of the layout of the beam splitter unit 3 can be improved. Furthermore, when the optical resin 4 does not enter the opening 271b, a resin that does have optical transparency with respect to the measurement light L0 and the laser light L10 may be used instead of the optical resin 4.

Sixth Embodiment

[Configuration of Optical Module]

Figure 14:
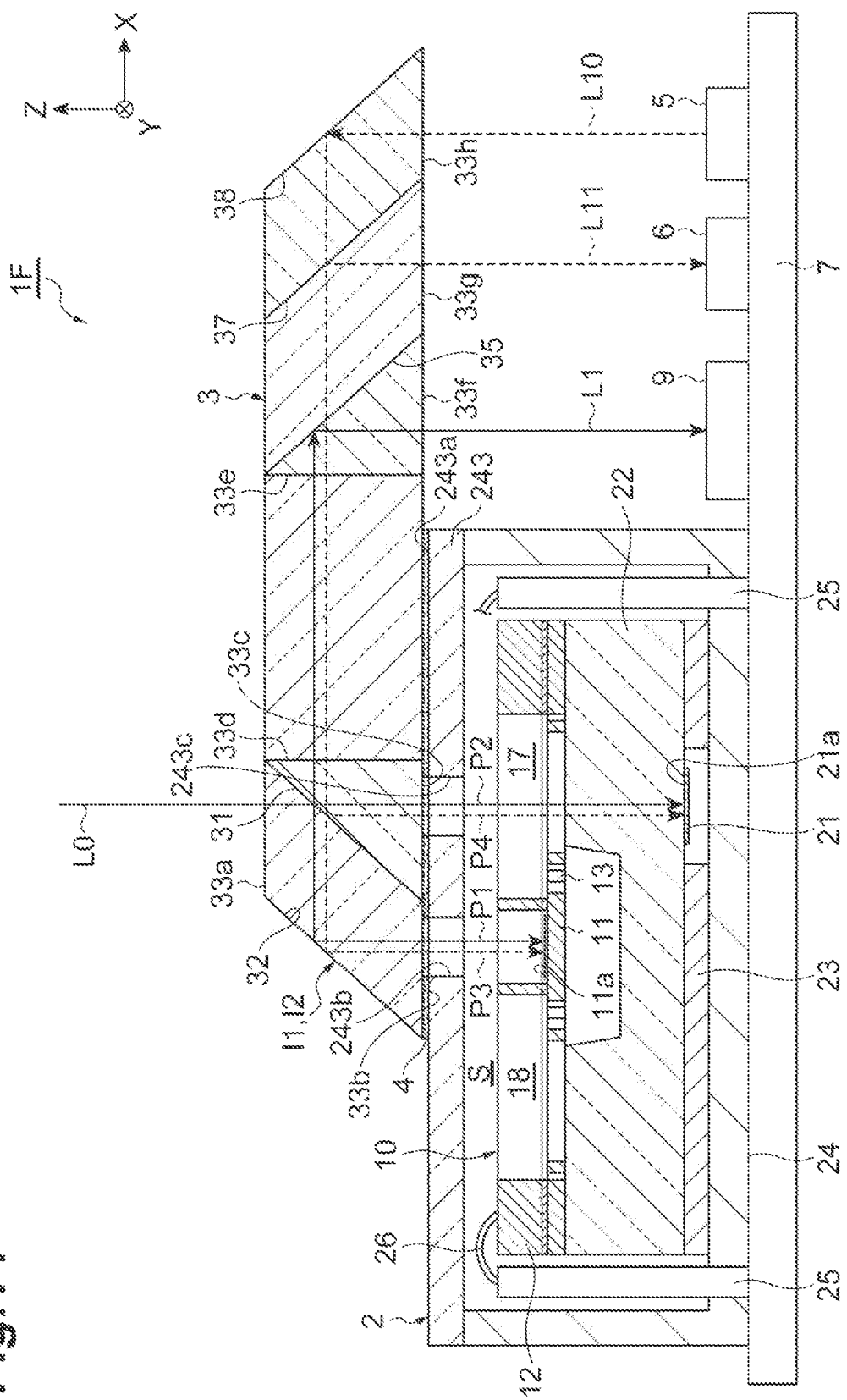
FIG. 14 is a longitudinal sectional view of an optical module of a sixth embodiment.

As illustrated in FIG. 14, an optical module 1F is mainly different from the optical module 1A illustrated in FIG. 1 in that the beam splitter unit 3 constitutes an interference optical system I1 for the measurement light L0 and an interference optical system I2 for the laser light L10 along with the movable mirror 11 and the fixed mirror 21. The optical module 1F includes a photodetector 9 in addition to the light source 5, the photodetector 6, and the circuit board 7. The photodetector 9 detects the measurement light L1 (the interference light of the measurement light L1) emitted from the interference optical system I1. The photodetector 9 is configured as, for example, a photodiode or the like. The light source 5, the plurality of photodetectors 6 and 9, and the mirror unit 2 are mounted on the same circuit board 7.

The beam splitter unit 3 includes a half mirror surface 31, a total reflection mirror surface 32, a dichroic mirror surface 35, a half mirror surface 37, a total reflection mirror surface 38, and a plurality of optical surfaces 33a, 33b, 33c, 33d, 33e, 33f, 33g, and 33h. The beam splitter unit 3 is configured by bonding a plurality of optical blocks. The half mirror surface 37 is formed by, for example, a dielectric multilayer. The total reflection mirror surface 38 is formed by, for example, a metal film.

The optical surface 33a is, for example, a surface perpendicular to the Z-axis direction and overlaps the mirror surface 21a of the fixed mirror 21 when viewed from the Z-axis direction. The half mirror surface 31 is, for example, a surface inclined by 45° with respect to the optical surface 33a and overlaps the mirror surface 21a of the fixed mirror 21 when viewed from the Z-axis direction. The half mirror surface 31 is located between the optical surface 33a and the mirror surface 21a of the fixed mirror 21 in the Z-axis direction. The total reflection mirror surface 32 is a surface parallel to the half mirror surface 31, overlaps the mirror surface 11a of the movable mirror 11 when viewed from the Z-axis direction, and overlaps the half mirror surface 31 when viewed from the X-axis direction.

The optical surface 33b is a surface parallel to the optical surface 33a and overlaps the mirror surface 11a of the movable mirror 11 when viewed from the Z-axis direction. The optical surface 33b is located between the total reflection mirror surface 32 and the mirror surface 11a of the movable mirror 11 in the Z-axis direction. The optical surface 33c is a surface parallel to the optical surface 33a and overlaps the mirror surface 21a of the fixed mirror 21 when viewed from the Z-axis direction. The optical surface 33c is located between the half mirror surface 31 and the mirror surface 21a of the fixed mirror 21 in the Z-axis direction. The optical surface 33d is a surface perpendicular to the optical surface 33a and overlaps the half mirror surface 31 when viewed from the X-axis direction. The optical surface 33d is located at the side opposite to the total reflection mirror surface 32 with respect to the half mirror surface 31 in the X-axis direction.

The optical surface 33e is a plane parallel to the optical surface 33d and overlaps the optical surface 33d when viewed from the X-axis direction. The optical surface 33e is located at the side opposite to the half mirror surface 31 with respect to the optical surface 33d in the X-axis direction. The dichroic mirror surface 35 is, for example, a surface inclined by 45° with respect to the optical surface 33e, overlaps the photodetector 9 when viewed from the Z-axis direction, and overlaps the optical surface 33e when viewed from the X-axis direction. The dichroic mirror surface 35 is located at the side opposite to the half mirror surface 31 with respect to the optical surface 33e in the X-axis direction. The half mirror surface 37 is a surface parallel to the dichroic mirror surface 35, overlaps the photodetector 6 when viewed from the Z-axis direction, and overlaps the dichroic mirror surface 35 when viewed from the X-axis direction. The half mirror surface 37 is located at the side opposite to the optical surface 33e with respect to the dichroic mirror surface 35 in the X-axis direction. The total reflection mirror surface 38 is a surface parallel to the dichroic mirror surface 35, overlaps the light source 5 when viewed from the Z-axis direction, and overlaps the half mirror surface 37 when viewed from the X-axis direction. The total reflection mirror surface 38 is located at the side opposite to the dichroic mirror surface 35 with respect to the half mirror surface 37 in the X-axis direction.

The optical surface 33f is a surface parallel to the optical surface 33a and overlaps the photodetector 9 when viewed from the Z-axis direction. The optical surface 33f is located between the dichroic mirror surface 35 and the photodetector 9 in the Z-axis direction. The optical surface 33g is a surface parallel to the optical surface 33a and overlaps the photodetector 6 when viewed from the Z-axis direction. The optical surface 33g is located between the half mirror surface 37 and the photodetector 6 in the Z-axis direction. The optical surface 33h is a surface parallel to the optical surface 33a and overlaps the light source 5 when viewed from the Z-axis direction. The optical surface 33h is located between the total reflection mirror surface 38 and the light source 5 in the Z-axis direction.

In the optical module 1F with the above-described configuration, when the measurement light L0 is incident from the outside of the optical module 1F to the beam splitter unit 3 through the optical surface 33a, a part of the measurement light L0 is sequentially reflected by the half mirror surface 31 and the total reflection mirror surface 32 and travels toward the mirror surface 11a of the movable mirror 11. Then, a part of the measurement light L0 is reflected by the mirror surface 11a of the movable mirror 11, travels in the reverse direction on the same optical path (the optical path P1), and is transmitted through the half mirror surface 31.

Meanwhile, the remaining part of the measurement light L0 is transmitted through the half mirror surface 31, passes through the first optical function portion 17, is further transmitted through the support body 22, and travels toward the mirror surface 21a of the fixed mirror 21. Then, the remaining part of the measurement light L0 is reflected by the mirror surface 21a of the fixed mirror 21, travels in the reverse direction on the same optical path (the optical path P2), and is reflected by the half mirror surface 31.

A part of the measurement light L0 transmitted through the half mirror surface 31 and the remaining part of the measurement light L0 reflected by the half mirror surface 31 become the measurement light L1 that is the interference light and the measurement light L1 is reflected by the dichroic mirror surface 35, is incident to the photodetector 9, and is detected by the photodetector 9.

Further, when the laser light L10 emitted from the light source 5 is incident to the beam splitter unit 3 through the optical surface 33h, the laser light L10 is reflected by the total reflection mirror surface 38, is sequentially transmitted through the half mirror surface 37 and the dichroic mirror surface 35, and travels toward the half mirror surface 31. A part of the laser light L10 is transmitted through the half mirror surface 31, is reflected by the total reflection mirror surface 32, and travels toward the mirror surface 11a of the movable mirror 11. Then, a part of the laser light L10 is reflected by the mirror surface 11a of the movable mirror 11, travels in the reverse direction on the same optical path (the optical path P3), and is transmitted through the half mirror surface 31.

Meanwhile, the remaining part of the laser light L10 is reflected by the half mirror surface 31, passes through the first optical function portion 17, is further transmitted through the support body 22, and travels toward the mirror surface 21a of the fixed mirror 21. Then, the remaining part of the laser light L10 is reflected by the mirror surface 21a of the fixed mirror 21, travels in the reverse direction on the same optical path (the optical path P4), and is reflected by the half mirror surface 31.

A part of the laser light L10 transmitted through the half mirror surface 31 and the remaining part of the laser light L10 reflected by the half mirror surface 31 become the laser light L11 that is he interference light and the laser light L11 is transmitted through the dichroic mirror surface 35, is reflected by the half mirror surface 37, is incident to the photodetector 6, and is detected by the photodetector 6.

[Operation and Effect]

According to the optical module 1F, for the same reason as the above-described optical module 1A, it is possible to suppress deterioration in the movable performance of the movable mirror 11 and an increase in the size of the entire module while enlarging the mirror surface 11a of the movable mirror 11.

In the optical module 1F, the beam splitter unit 3 constitutes the interference optical system I2 for the laser light L10 along with the movable mirror 11 and the fixed mirror 21. Accordingly, since the laser light L11 that is the interference light of the laser light L10 is detected, it is possible to highly accurately measure the position of the mirror surface 11a of the movable mirror 11. Further, the beam splitter unit 3 constitutes the interference optical system I1 for the measurement light L0 and the interference optical system I2 for the laser light L10 along with the movable mirror 11 and the fixed mirror 21. For that reason, it is possible to decrease the number of parts of the mirror unit 2.

[Modified Example of Sixth Embodiment]

Figure 15:
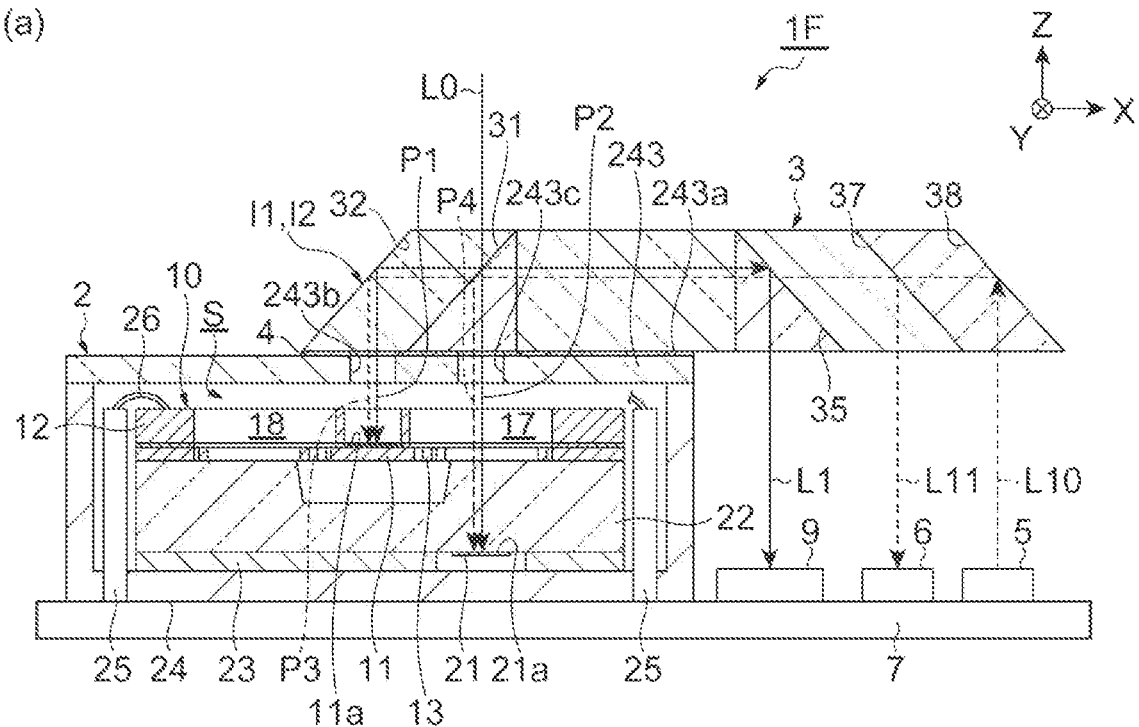
FIG. 15 is a longitudinal sectional view of a modified example of the optical module illustrated in FIG. 14.
Figure 15:
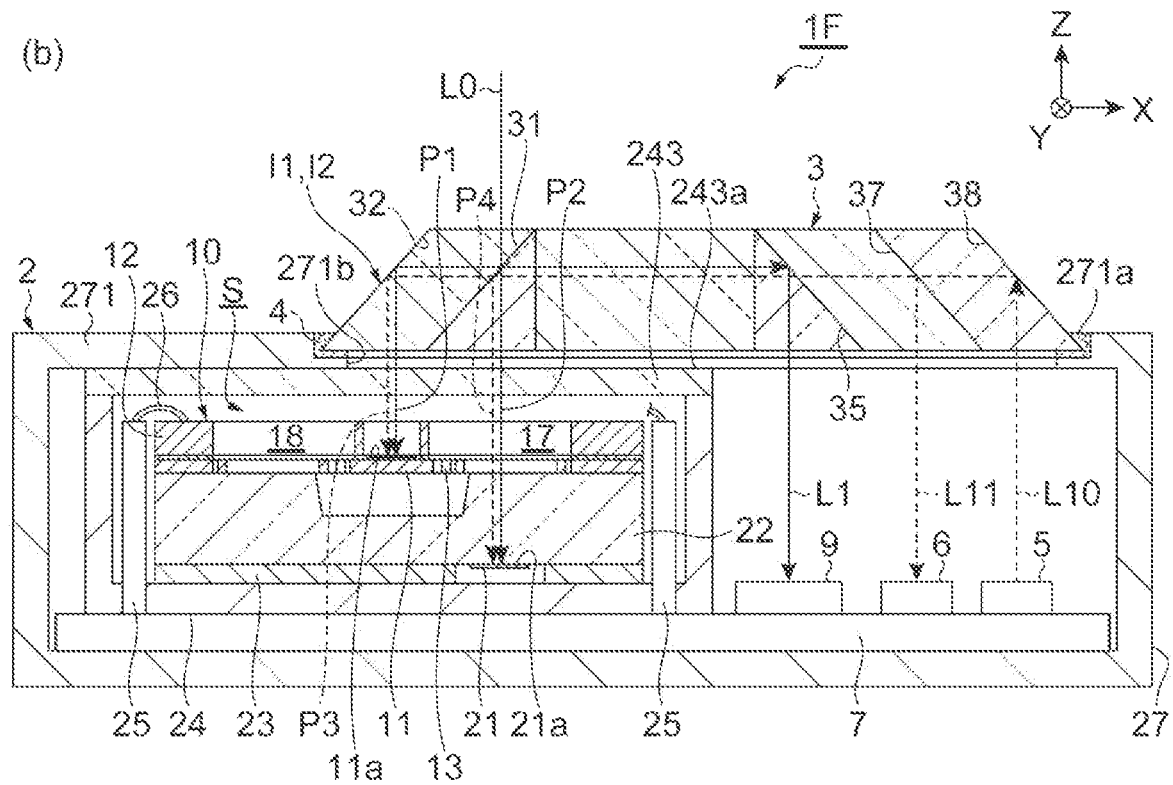

As illustrated in (a) of FIG. 15, the airtight space S may be formed by the package 24 and the beam splitter unit 3. In the optical module 1F illustrated in (a) of FIG. 15, the ceiling wall 243 of the package 24 is provided with an opening 243b through which the optical paths P1 and P3 pass and an opening 243c through which the optical paths P2 and P4 pass. Each of the openings 243b and 243c penetrates the ceiling wall 243 in the Z-axis direction. The beam splitter unit 3 is supported by the ceiling wall 243 while blocking each of the openings 243b and 243c. Specifically, the beam splitter unit 3 is fixed to the surface 243a of the ceiling wall 243 by the optical resin 4. According to such a configuration, both of the formation of the airtight space S and the support of the beam splitter unit 3 can be realized by the simple package 24 including the ceiling wall 243 provided with the opening 243b through which the optical paths P1 and P3 pass and the opening 243c through which the optical paths P2 and P4 pass. Furthermore, in the optical module 1F illustrated in (a) of FIG. 15, the ceiling wall 243 may not have optical transparency with respect to the measurement light L0 and the laser light L10. Further, when the optical resin 4 does not enter each of the openings 243b and 243c, a resin that does not have optical transparency with respect to the measurement light L0 and the laser light L10 may be used instead of the optical resin 4. Further, the ceiling wall 243 of the package 24 may be provided with one opening through which the plurality of optical paths P1, P2, P3, and P4 pass.

Further, as illustrated in (b) of FIG. 15, the support structure 27 supporting the beam splitter unit 3 may be provided separately from the package 24 forming the airtight space S. In the optical module 1F illustrated in (b) of FIG. 15, the beam splitter unit 3 is supported by the support structure 27 while being separated from the ceiling wall 243. Specifically, the beam splitter unit 3 is fixed to the inner surface of the concave portion 271a by the optical resin 4 while a part of the beam splitter unit 3 is disposed in the concave portion 271a formed in the wall portion 271 of the support structure 27. The wall portion 271 faces the ceiling wall 243 in the Z-axis direction and the concave portion 271a is opened to the side opposite to the ceiling wall 243 in the Z-axis direction. The bottom surface of the concave portion 271a is provided with one opening 271b through which the plurality of optical paths P1, P2, P3, and P4 pass. According to such a configuration, since the support structure 27 supporting the beam splitter unit 3 is provided separately from the package 24, the degree of freedom of the layout of the beam splitter unit 3 can be improved. Furthermore, when the optical resin 4 does not enter the opening 271b, a resin that does not have optical transparency with respect to the measurement light L0 and the laser light L10 may be used instead of the optical resin 4.

Seventh Embodiment

[Configuration of Optical Module]

Figure 16:
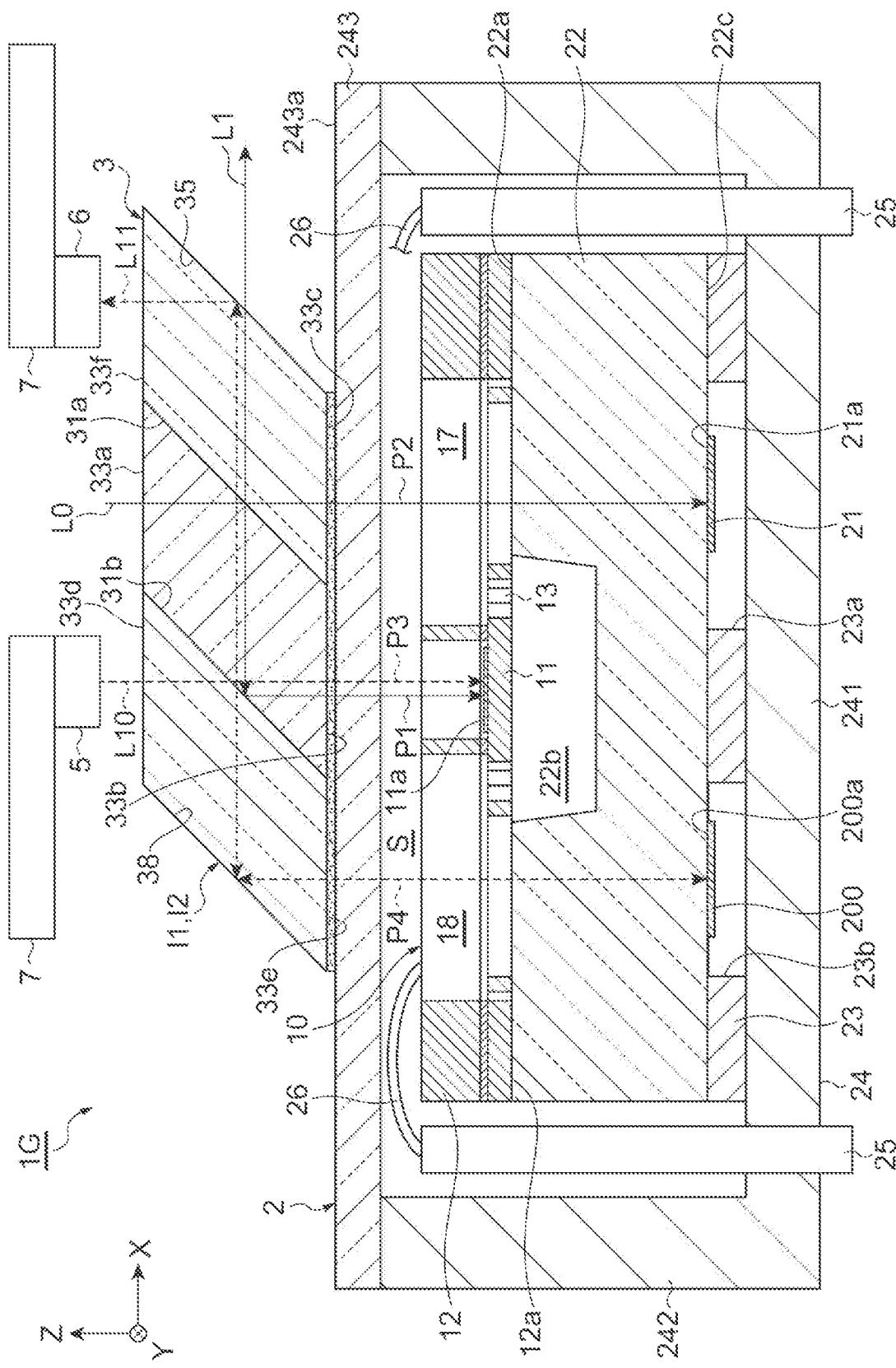
FIG. 16 is a longitudinal sectional view of an optical module of a seventh embodiment.

As illustrated in FIG. 16, an optical module 1G is mainly different from the optical module 1E illustrated in FIG. 12 in that the beam splitter unit 3 constitutes an interference optical system I2 for the laser light L10 along with the movable mirror 11 and a fixed mirror (a second fixed mirror) 200. The fixed mirror 200 includes a mirror surface 200a following a plane parallel to the main surface 12a of the base 12. The position of the fixed mirror 200 with respect to the base 12 is fixed. The mirror surface 200a of the fixed mirror 200 faces one side (the side of the beam splitter unit 3) in the Z-axis direction similarly to the mirror surface 11a of the movable mirror 11 and the mirror surface 21a of the fixed mirror 21. The fixed mirror 200 is disposed on the surface 22c of the support body 22 so as to be located inside the opening 23b formed in the sub-mount 23. The fixed mirror 200 is disposed at the other side of the movable mirror 11 (the side opposite to the fixed mirror 21) in the X-axis direction when viewed from the Z-axis direction. The fixed mirror 200 overlaps the second optical function portion 18 of the optical device 10 when viewed from the Z-axis direction. Furthermore, in the mirror unit 2, a part of the optical path P4 between the beam splitter unit 3 and the fixed mirror 200 is disposed in the airtight space S in addition to the movable mirror 11, the drive unit 13, a part of the optical path P1, and a part of the optical path P2.

The beam splitter unit 3 includes a plurality of half mirror surfaces 31a and 31b, a dichroic mirror surface 35, a total reflection mirror surface 38, and a plurality of optical surfaces 33a, 33b, 33c, 33d, 33e, and 33f. The beam splitter unit 3 is configured by bonding a plurality of optical blocks.

The optical surface 33a is, for example, a surface perpendicular to the Z-axis direction and overlaps the mirror surface 21a of the fixed mirror 21 when viewed from the Z-axis direction. The half mirror surface 31a is, for example, a surface inclined by 45° with respect to the optical surface 33a and overlaps the mirror surface 21a of the fixed mirror 21 when viewed from the Z-axis direction. The half mirror surface 31a is located between the optical surface 33a and the mirror surface 21a of the fixed mirror 21 in the Z-axis direction. The half mirror surface 31b is a surface parallel to the half mirror surface 31a, overlaps the mirror surface 11a of the movable mirror 11 when viewed from the Z-axis direction, and overlaps the half mirror surface 31a when viewed from the X-axis direction.

The optical surface 33b is a surface parallel to the optical surface 33a and overlaps the mirror surface 11a of the movable mirror 11 when viewed from the Z-axis direction. The optical surface 33b is located between the half mirror surface 31b and the mirror surface 11a of the movable mirror 11 in the Z-axis direction. The optical surface 33c is a surface parallel to the optical surface 33a and overlaps the mirror surface 21a of the fixed mirror 21 when viewed from the Z-axis direction. The optical surface 33c is located between the half mirror surface 31a and the mirror surface 21a of the fixed mirror 21 in the Z-axis direction.

The optical surface 33d is, for example, a surface perpendicular to the Z-axis direction and overlaps the light source 5 and the mirror surface 11a of the movable mirror 11 when viewed from the Z-axis direction. The optical surface 33d is located at the side opposite to the mirror surface 11a of the movable mirror 11 with respect to the half mirror surface 31b in the Z-axis direction. The total reflection mirror surface 38 is a surface parallel to the half mirror surface 31a, overlaps the mirror surface 200a of the fixed mirror 200 when viewed from the Z-axis direction, and overlaps the half mirror surface 31b when viewed from the X-axis direction. The optical surface 33e is a surface parallel to the optical surface 33d and overlaps the mirror surface 200a of the fixed mirror 200 when viewed from the Z-axis direction. The optical surface 33e is located between the total reflection mirror surface 38 and the mirror surface 200a of the fixed mirror 200 in the Z-axis direction.

The dichroic mirror surface 35 is a surface parallel to the half mirror surface 31a and overlaps the photodetector 6 when viewed from the Z-axis direction. The dichroic mirror surface 35 is located at the side opposite to the half mirror surface 31b with respect to the half mirror surface 31a in the X-axis direction. The optical surface 33f is, for example, a surface perpendicular to the Z-axis direction and overlaps the photodetector 6 when viewed from the Z-axis direction. The optical surface 33f is located between the dichroic mirror surface 35 and the photodetector 6 in the Z-axis direction.

In the optical module 1G with the above-described configuration, when the measurement light L0 is incident from the outside of the optical module 1G to the beam splitter unit 3 through the optical surface 33a, a part of the measurement light L0 is sequentially reflected by the half mirror surface 31a and the half mirror surface 31b and travels toward the mirror surface 11a of the movable mirror 11. Then, a part of the measurement light L0 is reflected by the mirror surface 11a of the movable mirror 11, travels in the reverse direction on the same optical path (the optical path P1), and is transmitted through the half mirror surface 31a.

Meanwhile, the remaining part of the measurement light L0 is transmitted through the half mirror surface 31a, passes through the first optical function portion 17, is further transmitted through the support body 22, and travels toward the mirror surface 21a of the fixed mirror 21. Then, the remaining part of the measurement light L0 is reflected by the mirror surface 21a of the fixed mirror 21, travels in the reverse direction on the same optical path (the optical path P2), and is reflected by the half mirror surface 31a.

A part of the measurement light L0 transmitted through the half mirror surface 31a and the remaining part of the measurement light L0 reflected by the half mirror surface 31a become the measurement light L1 that is the interference light and the measurement light L1 is transmitted through the dichroic mirror surface 35 and is emitted from the beam splitter unit 3 to the outside of the optical module 1G.

Further, when the laser light L10 emitted from the light source 5 is incident to the beam splitter unit 3 through the optical surface 33d, a part of the laser light L10 is transmitted through the half mirror surface 31b and travels toward the mirror surface 11a of the movable mirror 11. Then, a part of the laser light L10 is reflected by the mirror surface 11a of the movable mirror 11, travels in the reverse direction on the same optical path (the optical path P3), and is reflected by the half mirror surface 31b.

Meanwhile, the remaining part of the laser light L10 is sequentially reflected by the half mirror surface 31b and the total reflection mirror surface 38 and travels toward the mirror surface 200a of the fixed mirror 200. Then, the remaining part of the laser light L10 is reflected by the mirror surface 200a of the fixed mirror 200, travels in the reverse direction on the same optical path (the optical path P4), and is transmitted through the half mirror surface 31b.

A part of the laser light L10 reflected by the half mirror surface 31b and the remaining part of the laser light L10 transmitted through the half mirror surface 31b become the laser light L11 that is the interference light and the laser light L11 is transmitted through the half mirror surface 31a, is reflected by the dichroic mirror surface 35, is incident to the photodetector 6, and is detected by the photodetector 6.

[Operation and Effect]

According to the optical module 1G, for the same reason as the above-described optical module 1A, it is possible to suppress deterioration in the movable performance of the movable mirror 11 and an increase in the size of the entire module while enlarging the mirror surface 11a of the movable mirror 11.

In the optical module 1G, the beam splitter unit 3 constitutes the interference optical system I2 for the laser light L10 along with the movable mirror 11 and the fixed mirror 200. Accordingly, since the laser light L11 that is the interference light of the laser light L10 is detected, it is possible to highly accurately measure the position of the mirror surface 11a of the movable mirror 11. Further, the mirror surface 200a of the fixed mirror 200 faces one side in the Z-axis direction similarly to the mirror surface 21a of the fixed mirror 21. For that reason, the height of the mirror unit 2 in the Z-axis direction can be suppressed as compared with, for example, a positional relationship in which the mirror surface 11a of the movable mirror 11 and the mirror surface 200a of the fixed mirror 200 are orthogonal to each other. Moreover, a part of the optical path P4 between the beam splitter unit 3 and the fixed mirror 200 is disposed in the airtight space S similarly to a part of the optical path P2 between the beam splitter unit 3 and the fixed mirror 21 in addition to the optical path P1 between the beam splitter unit 3 and the movable mirror 11. Accordingly, it is possible to suppress the width of the mirror unit 2 in a direction (in the optical module 1G, the X-axis direction) perpendicular to the Z-axis direction.

[Modified Example of Seventh Embodiment]

Figure 17:
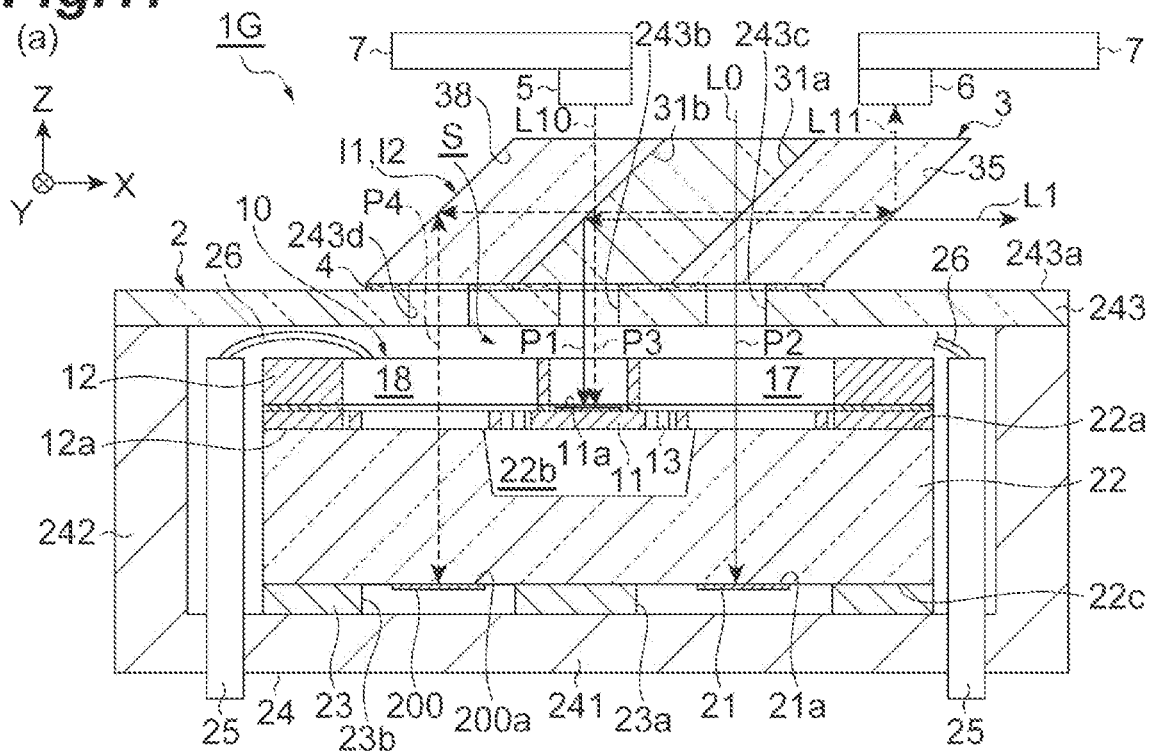
FIG. 17 is a longitudinal sectional view of a modified example of the optical module illustrated in FIG. 16.
Figure 17:
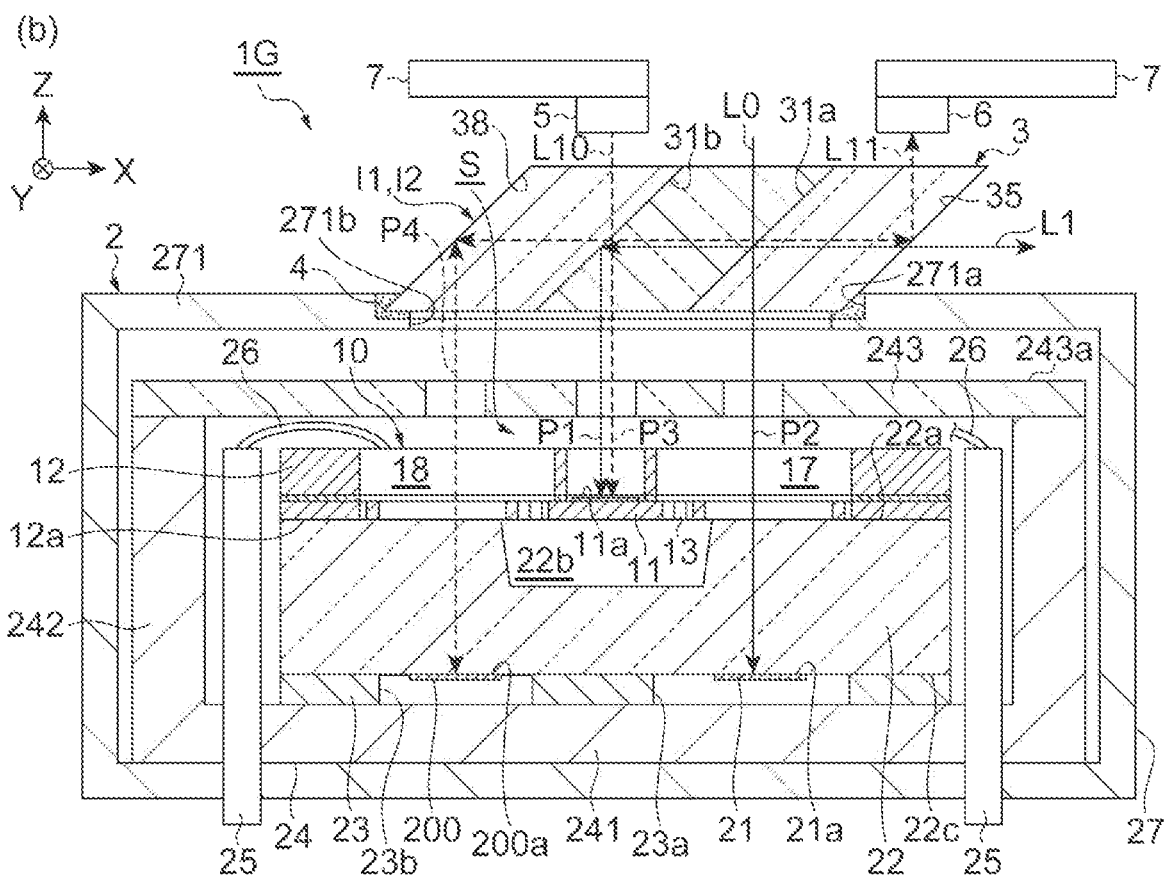

As illustrated in (a) of FIG. 17, the airtight space S may be formed by the package 24 and the beam splitter unit 3. In the optical module 1G illustrated in (a) of FIG. 17, the ceiling wall 243 of the package 24 is provided with an opening 243b through which the optical paths P1 and P3 pass, an opening 243c through which the optical path P2 passes, and an opening 243d through which the optical path P4 passes. Each of the openings 243b, 243c, and 243d penetrates the ceiling wall 243 in the Z-axis direction. The beam splitter unit 3 is supported by the ceiling wall 243 while blocking each of the openings 243b, 243c, and 243d. Specifically, the beam splitter unit 3 is fixed to the surface 243a of the ceiling wall 243 by the optical resin 4. According to such a configuration, both of the formation of the airtight space S and the support of the beam splitter unit 3 can be realized by the simple package 24 including the ceiling wall 243 provided with the opening 243b through which the optical paths P1 and P3 pass, the opening 243c through which the optical path P2 passes, and the opening 243d through which the optical path P3 passes. Furthermore, in the optical module 1G illustrated in (a) of FIG. 17, the ceiling wall 243 may not have optical transparency with respect to the measurement light L0 and the laser light L10. Further, when the optical resin 4 does not enter each of the openings 243b, 243c, and 243d, a resin that does not have optical transparency with respect to the measurement light L0 and the laser light L10 may be used instead of the optical resin 4. Further, the ceiling wall 243 of the package 24 may be provided with one opening through which the plurality of optical paths P1, P2, P3, and P4 pass.

Further, as illustrated in (b) of FIG. 17, the support structure 27 supporting the beam splitter unit 3 may be provided separately from the package 24 forming the airtight space S. In the optical module 1G illustrated in (b) of FIG. 17, the beam splitter unit 3 is supported by the support structure 27 while being separated from the ceiling wall 243. Specifically, the beam splitter unit 3 is fixed to the inner surface of the concave portion 271a by the optical resin 4 while a part of the beam splitter unit 3 is disposed in the concave portion 271a formed in the wall portion 271 of the support structure 27. The wall portion 271 faces the ceiling wall 243 in the Z-axis direction and the concave portion 271a is opened to the side opposite to the ceiling wall 243 in the Z-axis direction. The bottom surface of the concave portion 271a is provided with one opening 271b through which the plurality of optical paths P1, P2, P3, and P4 pass. According to such a configuration, since the support structure 27 supporting the beam splitter unit 3 is provided separately from the package 24, the degree of freedom of the layout of the beam splitter unit 3 can be improved. Furthermore, when the optical resin 4 does not enter the opening 271b, a resin that does not have optical transparency with respect to the measurement light L0 and the laser light L10 may be used instead of the optical resin 4.

Eighth Embodiment

[Configuration of Optical Module]

Figure 18:
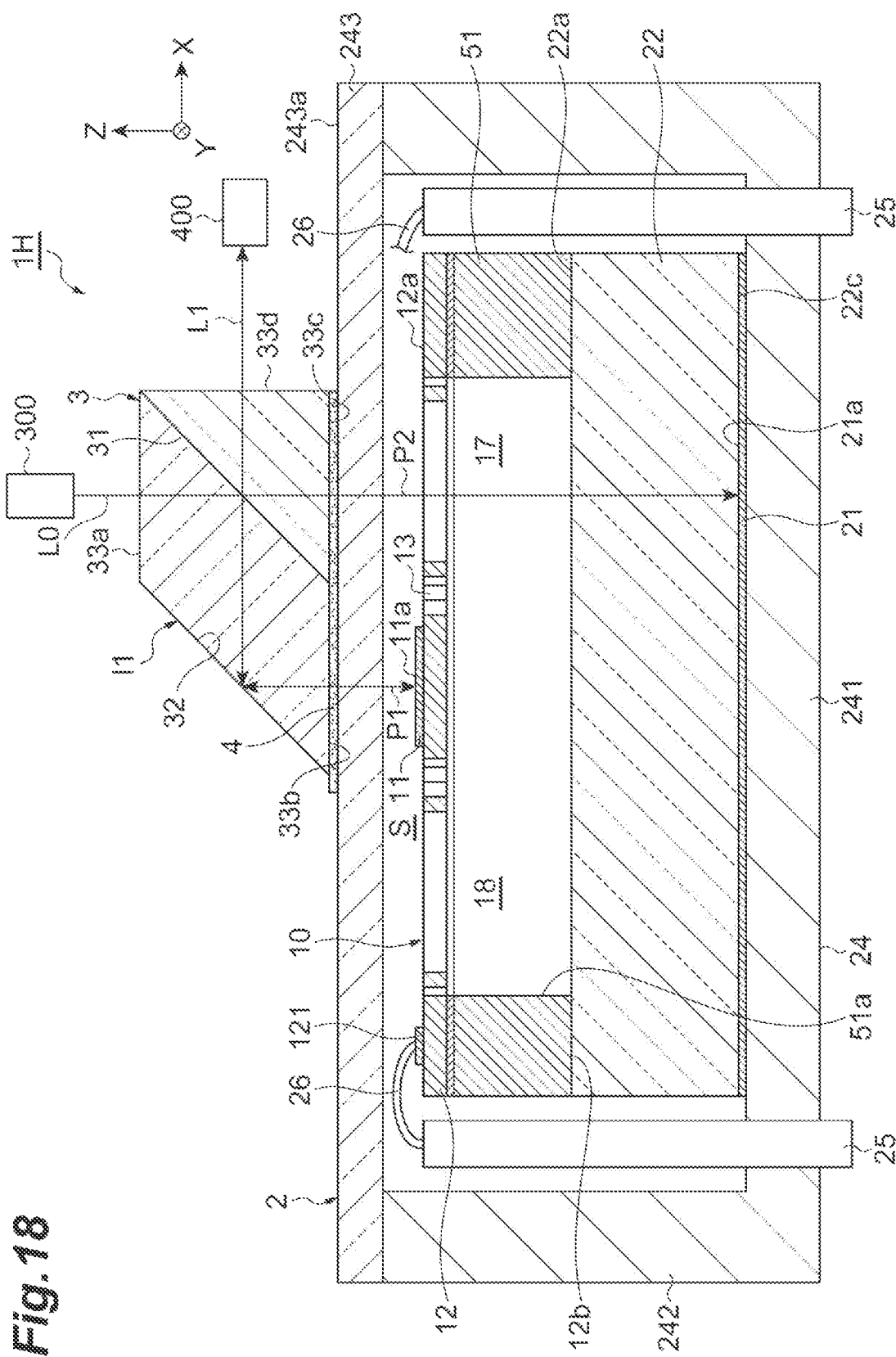
FIG. 18 is a longitudinal sectional view of an optical module of an eighth embodiment.

As illustrated in FIG. 18, an optical module 1H is mainly different from the optical module 1A illustrated in FIG. 1 in that the concave portion 22b is not formed in the support body 22. In the optical module 1H, the base 12 of the optical device 10 is fixed to the inner surface of the bottom wall 241 of the package 24. In the optical module 1H, the optical device 10 is disposed so that the main surface 12a of the base 12 faces the inner surface of the ceiling wall 243 and the main surface 12b of the base 12 faces the inner surface of the bottom wall 241.

In the optical module 1H, an opening 51a is formed in a region corresponding to the movable mirror 11 and the drive unit 13 in the support layer 51 of the base 12. Accordingly, the contact of the movable mirror 11 and the drive unit 13 with respect to the support body 22 when the movable mirror 11 is moved along the Z-axis direction is prevented. A metal film forming the movable mirror 11 is formed on a surface at the side of the main surface 12a in the main body 111. A metal film forming the fixed mirror 21 is formed in the entire region of the surface 22c of the support body 22.

In the optical module 1H with the above-described configuration, the measurement light L1 that is the interference light of the measurement light L0 can be obtained similarly to the optical module 1A illustrated in FIG. 1. Furthermore, the optical module 1H includes a measurement light incident unit 300 and a measurement light emission unit 400. The measurement light incident unit 300 is disposed so that the measurement light L0 is incident from the outside to the interference optical system I1. The measurement light incident unit 300 includes, for example, an optical fiber, a collimating lens, and the like. The measurement light emission unit 400 is disposed so that the measurement light L1 (the interference light of the measurement light L0) is emitted from the interference optical system I1 to the outside. The measurement light emission unit 400 includes, for example, an optical fiber, a collimating lens, and the like. Accordingly, it is possible to obtain the FTIR including the measurement light incident unit 300 and the measurement light emission unit 400.

[Operation and Effect]

According to the optical module 1H, for the same reason as the above-described optical module 1A, it is possible to suppress deterioration in the movable performance of the movable mirror 11 and an increase in the size of the entire module while enlarging the mirror surface 11a of the movable mirror 11.

[Modified Example of Eighth Embodiment]

Figure 19:
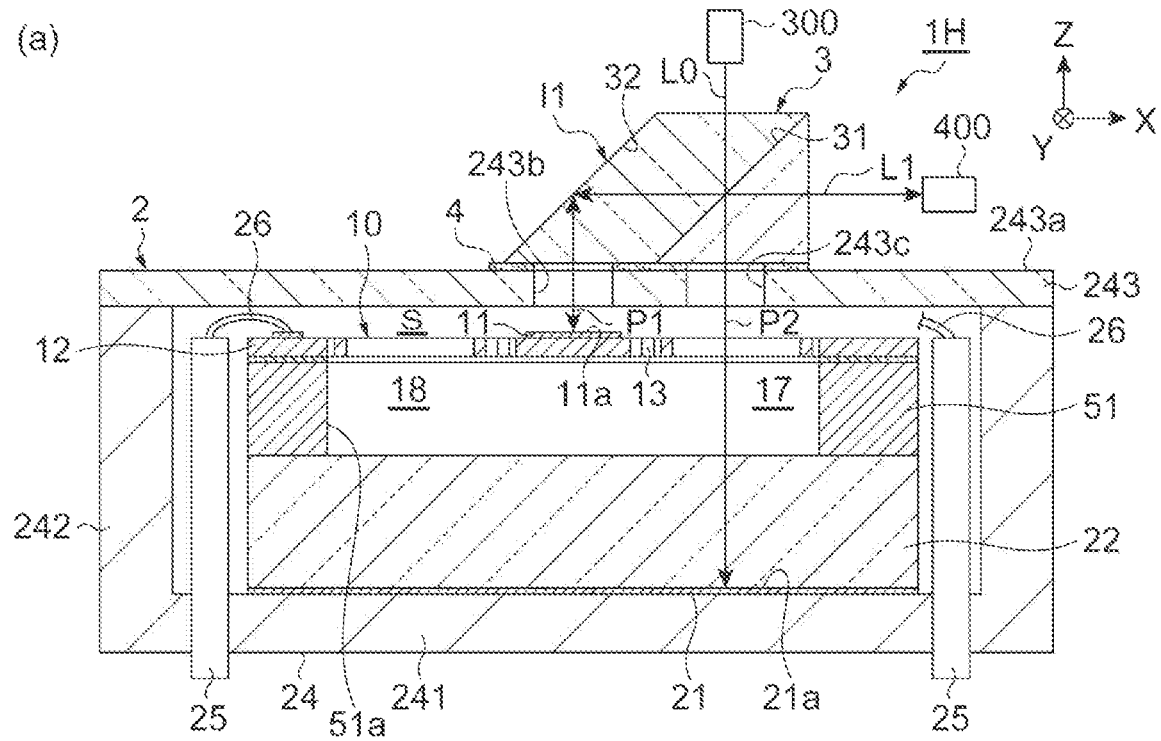
FIG. 19 is a longitudinal sectional view of a modified example of the optical module illustrated in FIG. 18.
Figure 19:
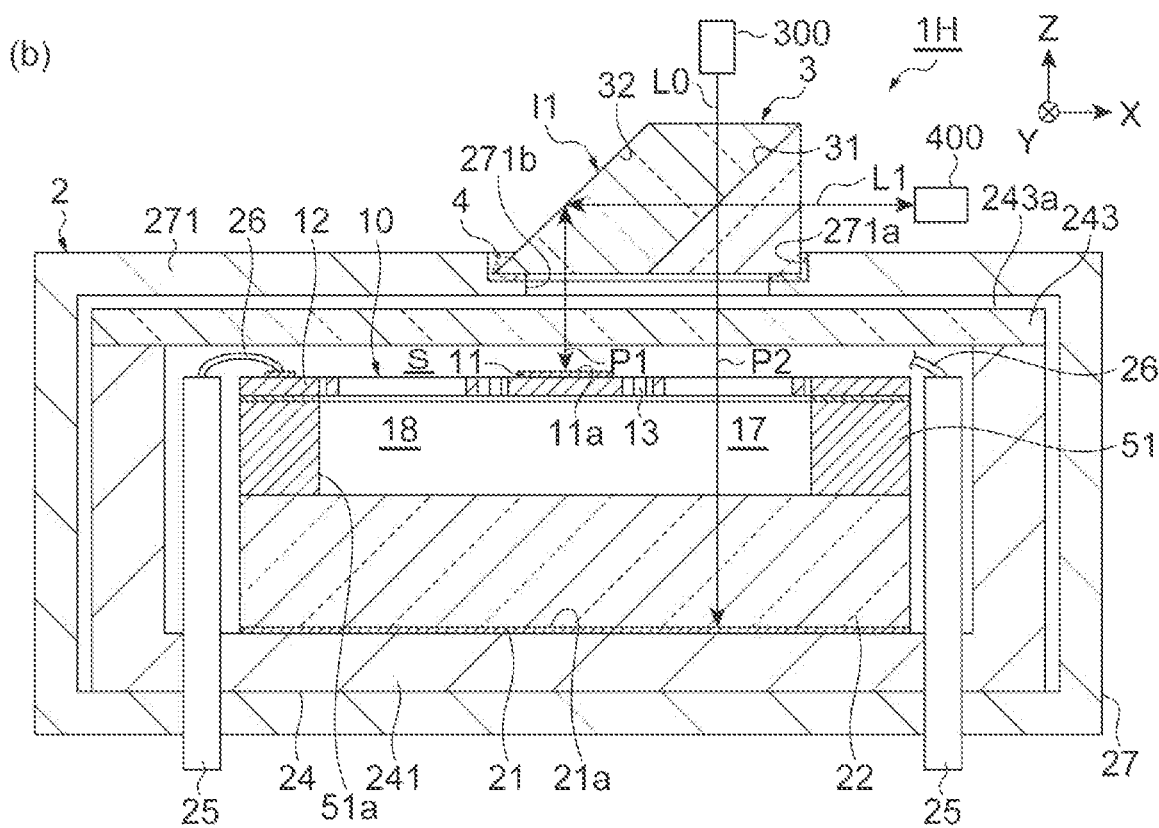

As illustrated in (a) of FIG. 19, the airtight space S may be formed by the package 24 and the beam splitter unit 3. In the optical module 1H illustrated in (a) of FIG. 19, the ceiling wall 243 of the package 24 is provided with an opening 243b through which the optical path P1 passes and an opening 243c through which the optical path P2 passes. Each of the openings 243b and 243c penetrates the ceiling wall 243 in the Z-axis direction. The beam splitter unit 3 is supported by the ceiling wall 243 while blocking each of the openings 243b and 243c. Specifically, the beam splitter unit 3 is fixed to the surface 243a of the ceiling wall 243 by the optical resin 4. According to such a configuration, both of the formation of the airtight space S and the support of the beam splitter unit 3 can be realized by the simple package 24 including the ceiling wall 243 provided with the opening 243b through which the optical path P1 passes and the opening 243c through which the optical path P2 passes. Furthermore, in the optical module 1H illustrated in (a) of FIG. 19, the ceiling wall 243 may not have optical transparency with respect to the measurement light L0. Further, when the optical resin 4 does not enter each of the openings 243b and 243c, a resin that does not have optical transparency with respect to the measurement light L0 may be used instead of the optical resin 4. Further, the ceiling wall 243 of the package 24 may be provided with one opening through which the plurality of optical paths P1 and P2 pass.

Further, as illustrated in (b) of FIG. 19, the support structure 27 supporting the beam splitter unit 3 may be provided separately from the package 24 forming the airtight space S. In the optical module 1H illustrated in (b) of FIG. 19, the beam splitter unit 3 is supported by the support structure 27 while being separated from the ceiling wall 243. Specifically, the beam splitter unit 3 is fixed to the inner surface of the concave portion 271a by the optical resin 4 while a part of the beam splitter unit 3 is disposed in the concave portion 271a formed in the wall portion 271 of the support structure 27. The wall portion 271 faces the ceiling wall 243 in the Z-axis direction and the concave portion 271a is opened to the side opposite to the ceiling wall 243 in the Z-axis direction. The bottom surface of the concave portion 271a is provided with one opening 271b through which the plurality of optical paths P1 and P2 pass. According to such a configuration, since the support structure 27 supporting the beam splitter unit 3 is provided separately from the package 24, the degree of freedom of the layout of the beam splitter unit 3 can be improved. Furthermore, when the optical resin 4 does not enter the opening 271b, a resin that does not have optical transparency with respect to the measurement light L0 may be used instead of the optical resin 4.

[Modified Examples]

As described above, the first to eighth embodiments of the present disclosure have been described, but the present disclosure is not limited to the above-described embodiments. For example, the material and shape of each component are not limited to the materials and shapes described above and various materials and shapes can be adopted. As an example, the material of the support body 22 is not limited as long as the support body corrects the optical path difference between the optical path P1 and the optical path P2 so that a difference between the optical path length of the optical path P1 (the optical path length considering the refractive index of each medium through which the optical path P1 passes) and the optical path length of the optical path P2 (the optical path length considering the refractive index of each medium through which the optical path P2 passes) decreases. The material of the support body 22 may be silicon, chalcogenide, or the like in addition to glass.

Further, the optical modules 1A, 1B, 1C, 1D, 1E, 1F, and 1G may include the measurement light incident unit 300 and the measurement light emission unit 400. In contrast, the optical module 1H may not include the measurement light incident unit 300 and the measurement light emission unit 400.

Further, the drive unit 13 of the optical device 10 is not limited to the above-described configuration as long as the drive unit can move the movable mirror 11 along a direction perpendicular to the main surface 12a of the base 12. As an example, the first elastic support portion 14 and the second elastic support portion 15 may have a symmetrical structure with respect to a plane passing through the center of the movable mirror 11 and perpendicular to the X-axis direction. Further, the first elastic support portion 14 and the second elastic support portion 15 may have a symmetrical structure with respect to a plane passing through the center of the movable mirror 11 and perpendicular to the Y-axis direction. Further, the drive unit 13 may include three or more elastic support portions elastically supporting the movable mirror 11. Furthermore, the actuator 16 is not limited to the electrostatic actuator and may be configured as, for example, a piezoelectric actuator, an electromagnetic actuator, or the like.

Further, in the optical modules 1E, 1F, and 1G, a filter cutting light in a wavelength range including a center wavelength of the laser light L10 may be disposed on the optical path along which the laser light L10 does not travel and the measurement light L0 travels. As an example, in the optical module 1E illustrated in FIG. 12, the above-described filter may be disposed at the front stage of the optical surface 33a. In this case, it is possible to prevent the measurement light L0 from becoming noise in the detection of the laser light L11 that is the interference light of the laser light L10.

Figure 20:
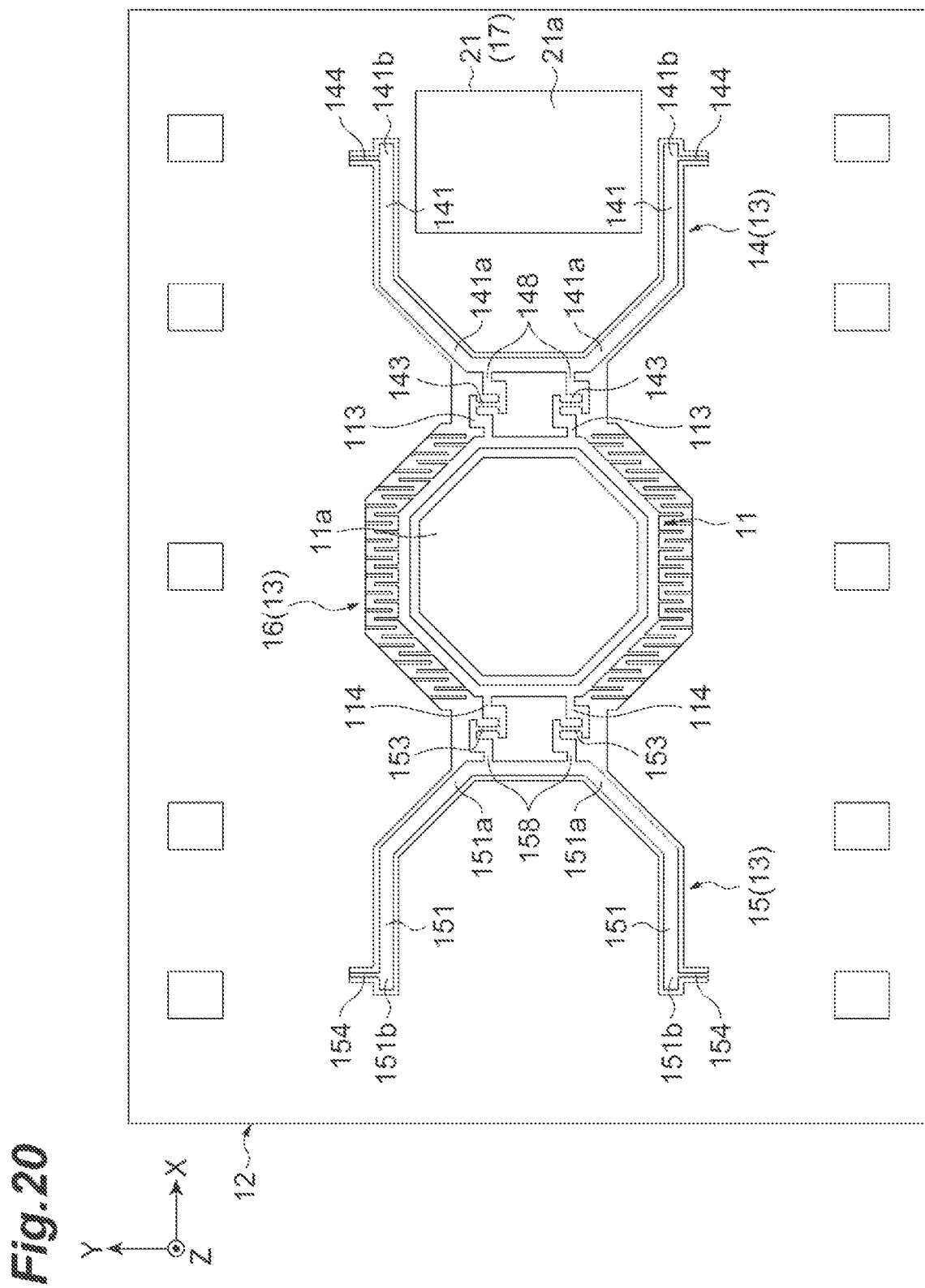
FIG. 20 is a plan view of the optical device illustrated in FIGS. 7 to 11.

The drive unit 13 of the optical device 10 illustrated in FIGS. 4 to 6 and FIGS. 12 to 19 has the same configuration as that of the drive unit 13 of the optical device 10 illustrated in FIGS. 1 to 3 and the drive unit 13 of the optical device 10 illustrated in FIGS. 7 to 11 has the configuration illustrated in FIG. 20 unlike the drive unit 13 of the optical device 10 illustrated in FIGS. 1 to 3. In the optical device 10 illustrated in FIG. 20, the end portion 141b at the side opposite to the movable mirror 11 in each of the pair of first levers 141 is connected to the base 12 through the torsion bar 144 and the end portion 151b at the side opposite to the movable mirror 11 in each of the pair of third levers 151 is connected to the base 12 through the torsion bar 154. That is, in the optical device 10 illustrated in FIG. 20, the pair of second levers 142 and the pair of fourth levers 152 are not provided. In this way, in the optical device 10 illustrated in FIG. 20, the structure of the first elastic support portion 14 and the second elastic support portion 15 is simplified.

Each configuration in one embodiment or modified example described above can be arbitrarily applied to each configuration in another embodiment or modified example.

REFERENCE SIGNS LIST 1A, 1B, 1C, 1D, 1E, 1F, 1G, 1H: optical module, 2: mirror unit, 3: beam splitter unit, 5: light source, 6: photodetector, 11: movable mirror, 11a: mirror surface, 12: base, 12a: main surface, 13: drive unit, 21: fixed mirror (first fixed mirror), 21a: mirror surface, 22: support body, 22c: surface, 24: package, 27: support structure, 29: support wall (wall), 29d, 29e: opening, 50: SOI substrate, 111: main body (movable portion), 112: wall portion (movable portion), 113, 114: bracket (movable portion), 200: fixed mirror (second fixed mirror), 200a: mirror surface, 243: ceiling wall (wall), 243b, 243c: opening, I1: interference optical system (first interference optical system), I2: interference optical system (second interference optical system), L0, L1: measurement light, L10, L11: laser light, P1: optical path (first optical path), P2: optical path (second optical path), P4: optical path, S: airtight space.

The invention claimed is:

1. A mirror unit comprising:
   a base which includes a first main surface and a second main surface opposite each other;
   a movable mirror which includes a mirror surface following a plane parallel to the first main surface and is supported by the base so as to be movable along a first direction perpendicular to the first main surface;
   a drive unit which includes at least a portion connected to the base and the movable mirror, and moves the movable mirror along the first direction;
   a first member which includes a first surface fixed to the first main surface and a first recess formed on the first surface so as to correspond to the movable mirror and the drive unit; and
   a second member which includes a second surface fixed to the second main surface and a second recess formed on the second surface so as to correspond to the movable mirror and the drive unit.

2. The mirror unit according to claim 1, wherein an airtight space is formed by the base, the first member and the second member.

3. The mirror unit according to claim 1, wherein the first recess is formed on the first surface so as to expand toward the movable mirror and the drive unit.

4. The mirror unit according to claim 1, wherein the second member has optical transparency.

5. The mirror unit according to claim 1, wherein the base is provided with a plurality of electrode pads, and the plurality of electrode pads are arranged along a longitudinal direction of the base.

6. The mirror unit according to claim 5, wherein the plurality of electrode pads are arranged along the longitudinal direction in portions of the base on both sides of the movable mirror and the drive unit.

7. The mirror unit according to claim 1, wherein the drive unit includes a first comb electrode provided on the base side and a second comb electrode provided on the movable mirror side, and each of a plurality of comb fingers of the first comb electrode is located between each of a plurality of comb fingers of the second comb electrode.

* * * * *